(12) United States Patent
Nakamura et al.

(10) Patent No.: US 7,084,718 B2
(45) Date of Patent: Aug. 1, 2006

(54) BAND ELIMINATION FILTER, FILTER DEVICE, ANTENNA DUPLEXER AND COMMUNICATION APPARATUS

(75) Inventors: Hiroyuki Nakamura, Osaka (JP); Shun-Ichi Seki, Hyogo (JP); Keiji Onishi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/657,944

(22) Filed: Sep. 9, 2003

(65) Prior Publication Data

US 2005/0099244 A1    May 12, 2005

(30) Foreign Application Priority Data

Sep. 10, 2002   (JP) .............................. 2002-263789
Aug. 12, 2003   (JP) .............................. 2003-292646

(51) Int. Cl.
*H03H 9/70*  (2006.01)
*H03H 9/72*  (2006.01)
*H03H 9/54*  (2006.01)
*H03H 9/64*  (2006.01)

(52) U.S. Cl. ....................... 333/133; 333/189; 333/193
(58) Field of Classification Search ................ 333/133, 333/193, 195, 187, 189
See application file for complete search history.

(56) References Cited

U.S. PATENT DOCUMENTS

| | | | |
|---|---|---|---|
| 3,704,433 A * | 11/1972 | Garrison et al. ............ 333/192 |
| 4,803,449 A * | 2/1989 | Hikita et al. ................ 333/193 |
| 4,903,297 A * | 2/1990 | Rist et al. .................... 380/208 |
| 4,910,481 A * | 3/1990 | Sasaki et al. ............... 333/134 |
| 4,954,793 A | 9/1990 | Misu et al. |
| 5,077,545 A * | 12/1991 | Gopani et al. .............. 333/195 |
| 5,617,065 A * | 4/1997 | Dydyk ........................ 333/186 |
| 6,346,859 B1* | 2/2002 | Saitou ........................ 330/286 |
| 6,404,302 B1* | 6/2002 | Satoh et al. ................ 333/193 |
| 6,424,238 B1 | 7/2002 | Penunuri |
| 6,710,677 B1* | 3/2004 | Beaudin et al. ............. 333/133 |
| 6,879,224 B1* | 4/2005 | Frank .......................... 333/189 |
| 2002/0021192 A1 | 2/2002 | Klee et al. .................. 333/187 |

FOREIGN PATENT DOCUMENTS

| | | |
|---|---|---|
| CA | 2378303 A1 | 1/2001 |
| DE | 198 18 826 A | 11/1999 |
| DE | 199 32 649 A | 2/2001 |
| EP | 0 897 218 A | 2/1999 |
| EP | 1 050 962 A1 | 11/2000 |
| JP | 07-038376 | 2/1995 |
| JP | 07-263995 | 10/1995 |
| JP | 10-065490 | * 3/1998 |
| JP | 10-093375 | 4/1998 |
| JP | 2001-217675 | 8/2001 |
| WO | WO 00/30252 | 5/2000 |

* cited by examiner

OTHER PUBLICATIONS

European Search Report for EP 03 02 0624, dated Dec. 16, 2003.

*Primary Examiner*—Barbara Summons
(74) *Attorney, Agent, or Firm*—RatnerPrestia

(57) ABSTRACT

A band elimination filter includes an input terminal and an output terminal. A capacitor is coupled between a first terminal connected to the input terminal and a second terminal connected to the output terminal. The first terminal is grounded only via a first grounding point. The second terminal is grounded only via a second grounding point. A first acoustic resonator is connected between the first terminal and the first grounding point and a second acoustic resonator is connected between the second terminal and the second grounding point.

37 Claims, 20 Drawing Sheets

Fig. 19 (a) PRIOR ART
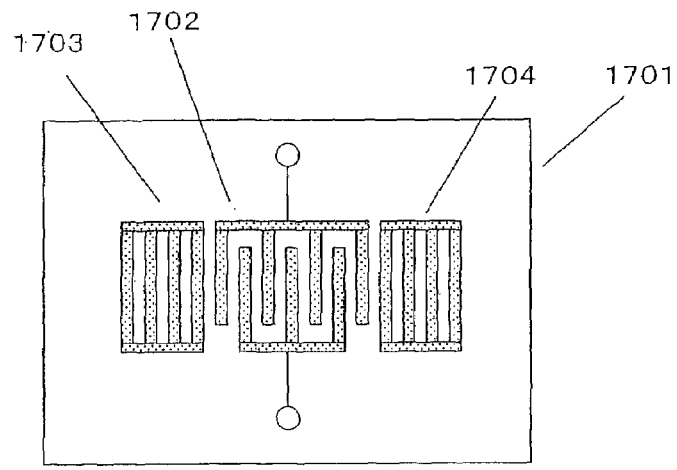
Fig. 19 (b) PRIOR ART
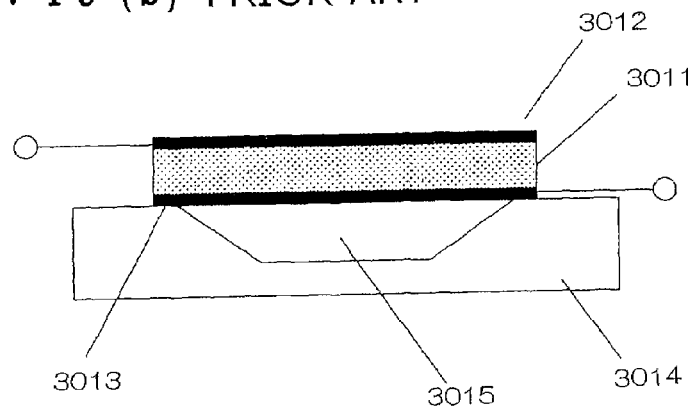
Fig. 19 (c) PRIOR ART
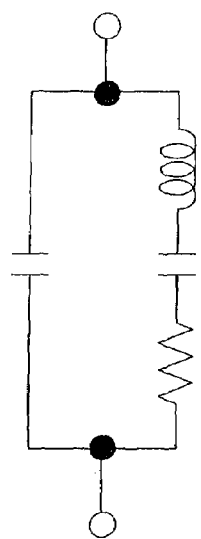

Fig. 20 (a) PRIOR ART
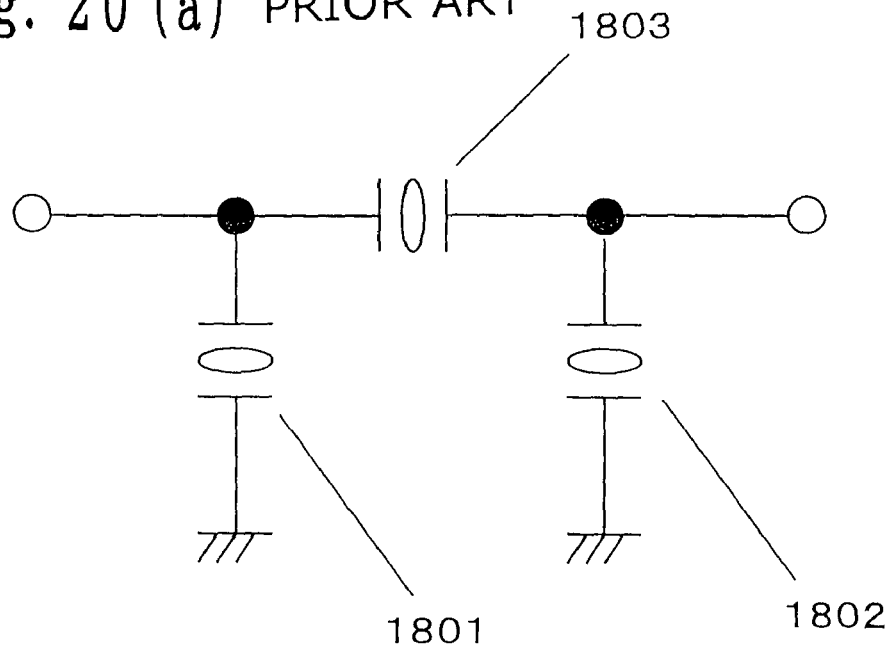
Fig. 20 (b) PRIOR ART
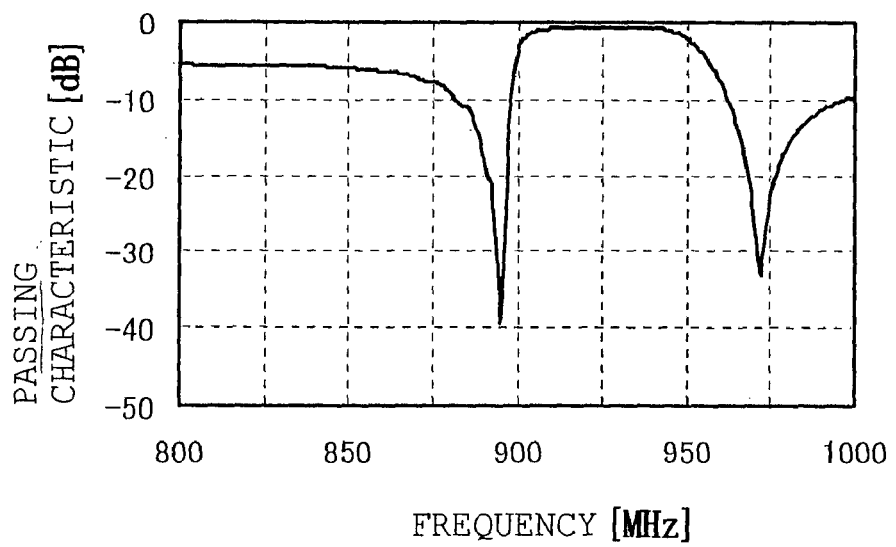

Fig. 21 (a) PRIOR ART
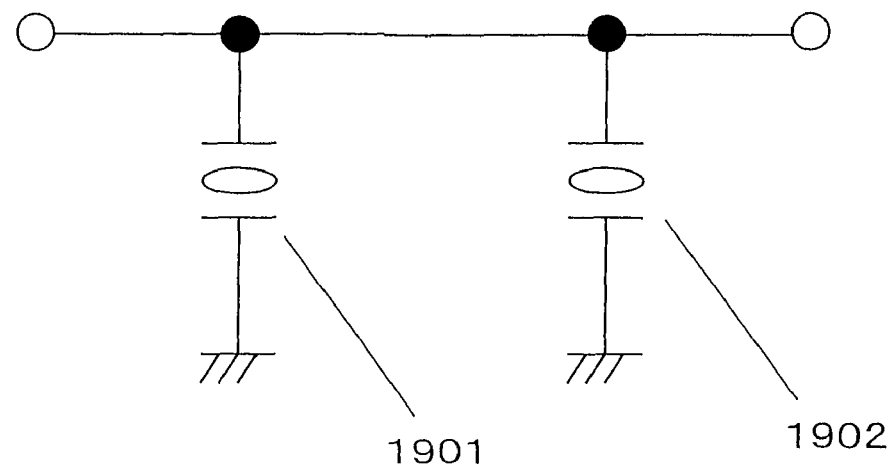
Fig. 21 (b) PRIOR ART
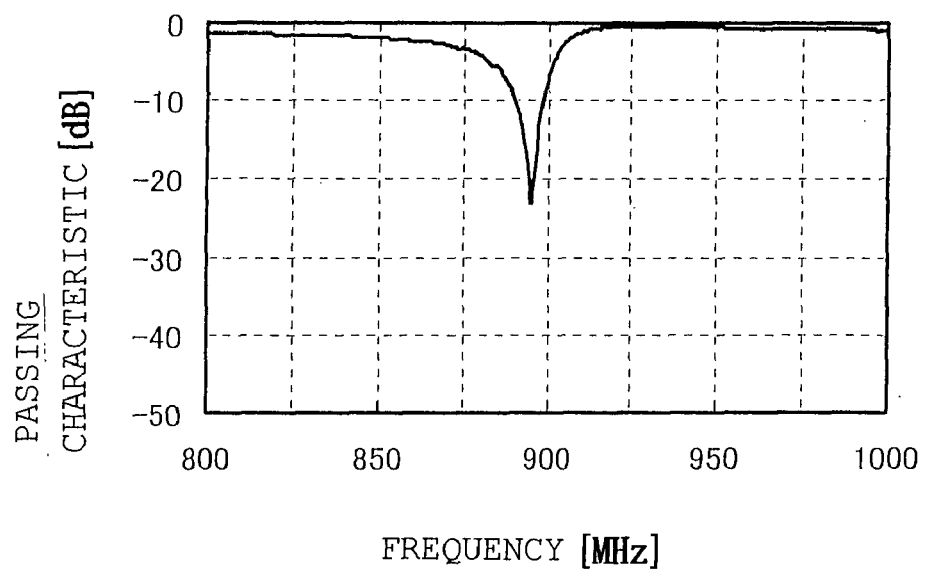

BAND ELIMINATION FILTER, FILTER DEVICE, ANTENNA DUPLEXER AND COMMUNICATION APPARATUS

BACKGROUND OF THE INVENTION

1. Field of the Invention

The present invention relates to a band elimination filter used in a communication apparatus, such as a cellular phone and car phone.

2. Related Art of the Invention

In the prior art a surface acoustic wave filter or piezoelectric filter has been used as an RF filter in communication apparatus. The surface acoustic wave filters mainly used include a longitudinal coupled mode filter having a plurality of interdigital transducer electrodes (IDT electrodes) closely arranged in the propagation direction and a ladder filter having surface acoustic wave resonators interconnected in a ladder-like arrangement. On the other hand, as the piezoelectric filter, a bulk wave filter is used. It has been desired that these filters are increased in performance and reduced in size.

In the following, a conventional band elimination filter will be described with reference to the drawings.

FIG. 19(a) shows a configuration of a surface acoustic wave resonator. In this drawing, the surface acoustic wave resonator comprises an IDT electrode 1702 formed on the piezoelectric substrate 1701, reflector electrodes 1703 and 1704.

FIG. 19(b) shows a configuration of a piezoelectric resonator. In this drawing, the piezoelectric resonator comprises a piezoelectric layer 3011, an upper electrode 3012 formed on an upper principal plane of the piezoelectric layer 3011, a lower electrode 3013 formed on a lower principal plane of the piezoelectric layer 3011 and a substrate 3014. There is formed a depression in the surface of the substrate 3014 which is in contact with the lower electrode 3013, and the depression constitutes a cavity 3015. In this configuration, the upper electrode 3012, the lower electrode 3013, the piezoelectric layer 3011 sandwiched between the upper electrode 3012 and the lower electrode 3013, and the part of the substrate 3014 which constitutes the cavity 3015 constitute the piezoelectric resonator.

The surface acoustic wave resonator and the piezoelectric resonator are each represented by an equivalent circuit shown in FIG. 19(c), and have electric characteristics that provide serial resonance and parallel resonance, respectively.

Connecting a plurality of such surface acoustic wave resonators in a ladder arrangement provides a ladder surface acoustic wave filter (for example, see Japanese Patent No. 3152418, the disclosure of which is incorporated herein by reference in its entirety).

Such a conventional acoustic resonator will now be described by taking a surface acoustic wave resonator as an example.

FIG. 20(a) shows, as a conventional example 1, a configuration of a surface acoustic wave filter formed by interconnecting three surface acoustic wave resonators 1801, 1802 and 1803 in a π arrangement. As shown in FIG. 20(a), the surface acoustic wave resonators 1801 and 1802 each have one end grounded, and the other ends of the surface acoustic wave resonators are coupled to a transmission line at a predetermined interval, the transmission line 1804 having signal input and output terminals. The surface acoustic wave resonator 1803 is disposed in the predetermined interval on the transmission line 1804.

In this configuration, as for the passing characteristics, the pass band and the attenuation band of the filter depend on the resonance and anti resonance frequencies of the parallel surface acoustic wave resonators 1802 and 1803, which are placed in parallel with the serial surface acoustic wave resonator 1801 as shown in FIG. 20(b). However, there cannot be provided a band elimination filter having a low loss over a wide band.

FIG. 21(a) shows, as a conventional example 2, a circuit of a band elimination filter formed by connecting two surface acoustic wave resonators 1901 and 1902 in parallel. As shown in FIG. 21(a), the surface acoustic wave resonators 1901 and 1902 each have one end grounded, and the other ends of the surface acoustic wave resonators are coupled to a transmission line 1903 at a predetermined interval, the transmission line 1903 having signal input and output terminals. As shown in FIG. 21(b), although the filter has a low loss at frequencies higher than the stop band (attenuation pole), it has a high loss at frequencies lower than the stop band (attenuation pole).

As described above, with the surface acoustic wave filter composed of a plurality of acoustic resonators, such as surface acoustic wave resonators, used in communication apparatus or the like, it has been difficult to provide characteristics of a high attenuation within a desired frequency range and a low loss over wide frequency bands lower and higher than a stop band.

The present invention has been devised in view of the problem described above. An object of the invention is to provide a band elimination filter or the like that provides characteristics of a high attenuation within a desired frequency band and a low loss over wide frequency bands lower and higher than a stop band.

SUMMARY OF THE INVENTION

The $1^{st}$ aspect of the present invention is a band elimination filter, comprising:

a plurality of acoustic resonators each having one end grounded; and a transmission line to which the other end of each of said plurality of acoustic resonators is connected, wherein at least some of said other ends are coupled to the transmission line at predetermined intervals, and at least one reactance element is provided on said transmission line in all or a part of said predetermined intervals.

The $2^{nd}$ aspect of the present invention is the band elimination filter according to the $1^{st}$ aspect of the present invention, wherein said acoustic resonator is a surface acoustic wave resonator formed on a principal surface of a piezoelectric substrate.

The $3^{rd}$ aspect of the present invention is the band elimination filter according to the $2^{nd}$ aspect of the present invention, wherein a normalized impedance, which is obtained by normalizing the impedance of said reactance element with a characteristic impedance, is higher than 1.

The $4^{th}$ aspect of the present invention is the band elimination filter according to the $3^{rd}$ aspect of the present invention, wherein said normalized impedance is lower than 1.5.

The $5^{th}$ aspect of the present invention is the band elimination filter according to any of the $1^{st}$ to the $3^{rd}$ aspects of the present invention, wherein said reactance element is an inductor.

The 6th aspect of the present invention is the band elimination filter according to the 5th aspect of the present invention, wherein said inductor includes a wire used in wire mounting.

The 7th aspect of the present invention is the band elimination filter according to the 1st or the 2nd aspects of the present invention, wherein said reactance element is a capacitor.

The 8th aspect of the present invention is the band elimination filter according to the 1st or the 2nd aspects of the present invention, wherein said reactance element includes a capacitor and an inductor.

The 9th aspect of the present invention is the band elimination filter according to the 8th aspect of the present invention, wherein said reactance element includes a parallel circuit of a capacitor and an inductor.

The 10th aspect of the present invention is the band elimination filter according to the 8th aspect of the present invention, wherein said reactance element includes a serial circuit of a capacitor and an inductor.

The 11th aspect of the present invention is the band elimination filter according to the 1st aspect of the present invention, wherein said reactance element is a chip component.

The 12th aspect of the present invention is the band elimination filter according to the 1st aspect of the present invention, wherein said reactance element is formed on a piezoelectric substrate.

The 13th aspect of the present invention is the band elimination filter according to the 1st aspect of the present invention, wherein said reactance element is formed in a mounting substrate on which said band elimination filter is mounted.

The 14th aspect of the present invention is the band elimination filter according to the 13th aspect of the present invention, wherein said mounting substrate is a laminated body having a dielectric layer.

The 15th aspect of the present invention is the band elimination filter according to the 13th aspect of the present invention, wherein said acoustic resonators are face-down mounted on said mounting substrate.

The 16th aspect of the present invention is the band elimination filter according to the 2nd aspect of the present invention, wherein electrode pads of said surface acoustic wave resonators which are grounded are separated from each other on said piezoelectric substrate.

The 17th aspect of the present invention is the band elimination filter according to the 1st aspect of the present invention, wherein said acoustic resonator is a piezoelectric resonator.

The 18th aspect of the present invention is the band elimination filter according to the 17th aspect of the present invention, wherein said piezoelectric resonator is a bulk wave resonator having an upper electrode, a lower electrode and a piezoelectric layer sandwiched between said upper electrode and said lower electrode.

The 19th aspect of the present invention is the band elimination filter according to the 18th aspect of the present invention, wherein said piezoelectric layer is composed of a piezoelectric thin film.

The 20th aspect of the present invention is the band elimination filter according to the 18th aspect of the present invention, wherein said reactance element is formed using said electrodes of said bulk wave resonator.

The 21st aspect of the present invention is the band elimination filter according to the 1st aspect of the present invention, wherein said surface acoustic wave resonators have different resonance frequencies.

The 22nd aspect of the present invention is the band elimination filter according to the 1st aspect of the present invention, wherein said one end of each of said acoustic resonators is independently grounded wiring on a substrate.

The 23rd aspect of the present invention is the band elimination filter according to the 1st aspect of the present invention, wherein said reactance element is an acoustic resonator having a resonance frequency different from the resonance frequencies of said acoustic resonators by a predetermined amount.

The 24th aspect of the present invention is a filter device comprising a band elimination filter according to the 1st aspect of the present invention.

The 25th aspect of the present invention is an antenna duplexer, comprising:
 a transmission filter; and
 a receiving filter;
 wherein a band elimination filter according to the 24th aspect of the present invention is used as said transmission filter or said receiving filter.

The 26th aspect of the present invention is a communication apparatus, comprising:
 transmission means of transmitting a signal;
 receiving means of receiving a signal, and
 a band elimination filter according to the 1st aspect of the present invention is used in said transmission means and/or said receiving means.

BRIEF DESCRIPTION OF THE DRAWINGS

FIG. 19(a) shows a configuration of a surface acoustic wave resonator.

FIG. 19(b) shows a configuration of a piezoelectric resonator.

FIG. 19(c) shows an equivalent circuit diagram of the surface acoustic wave resonator and the piezoelectric resonator.

FIG. 20(a) shows a configuration of a surface acoustic wave filter in a conventional example 1.

FIG. 20(b) shows a passing characteristic of the surface acoustic wave filter in the conventional example 1.

FIG. 21(a) shows a configuration of a surface acoustic wave filter in the conventional example 2.

FIG. 21(b) shows a passing characteristic of the surface acoustic wave filter in the conventional example 2.

DESCRIPTION OF SYMBOLS

101 SURFACE ACOUSTIC WAVE RESONATOR
102 SURFACE ACOUSTIC WAVE RESONATOR
103 INDUCTOR
401 PIEZOELECTRIC SUBSTRATE
402 FIRST SURFACE ACOUSTIC WAVE RESONATOR
403 SECOND SURFACE ACOUSTIC WAVE RESONATOR
404 ELECTRODE PAD
405 ELECTRODE PAD
406 ELECTRODE PAD
407 ELECTRODE PAD
501 INPUT TERMINAL
502 OUTPUT TERMINAL
503 INDUCTOR
504 INDUCTOR COMPONENT
505 INDUCTOR COMPONENT
601 ELECTRODE PAD
701 INDUCTOR COMPONENT
801a, 801b, 801c, 801d TERMINAL
802a, 802b, 802c, 802d WIRE
901 SURFACE ACOUSTIC WAVE RESONATOR
902a, 902b BUMP
903a, 903b PAD
904a, 904b VIA HOLE
905a, 905b EXTERNAL TERMINAL
906 MOUNTING SUBSTRATE
1001 SURFACE ACOUSTIC WAVE RESONATOR
1002 SURFACE ACOUSTIC WAVE RESONATOR
1003 CAPACITOR
1201 SURFACE ACOUSTIC WAVE RESONATOR
1202 SURFACE ACOUSTIC WAVE RESONATOR
1203 CAPACITOR
1204 INDUCTOR
1205 CAPACITOR
1206 INDUCTOR
1301 INDUCTOR
1401 INDUCTOR
1501 PIEZOELECTRIC RESONATOR
1502 PIEZOELECTRIC RESONATOR
1503 INDUCTOR
1601 COMMUNICATION APPARATUS
1602 TRANSMISSION AMPLIFIER
1603 TRANSMISSION FILTER
1604 SWITCH
1605 ANTENNA
1606 RECEIVING FILTER
1607 RECEIVING AMPLIFIER
1608 ANTENNA DUPLEXER
1701 PIEZOELECTRIC SUBSTRATE
1702 IDT ELECTRODE
1703 REFLECTOR ELECTRODE
1704 REFLECTOR ELECTRODE
1801 SURFACE ACOUSTIC WAVE RESONATOR
1802 SURFACE ACOUSTIC WAVE RESONATOR
1803 SURFACE ACOUSTIC WAVE RESONATOR
1901 SURFACE ACOUSTIC WAVE RESONATOR
1902 SURFACE ACOUSTIC WAVE RESONATOR

PREFERRED EMBODIMENTS OF THE INVENTION

In the following, embodiments of the present invention will be described with reference to the drawings.

Embodiment 1

Now, a surface acoustic wave filter according to an embodiment 1 of the present invention will be described with reference to the drawings.

Figure 1A:
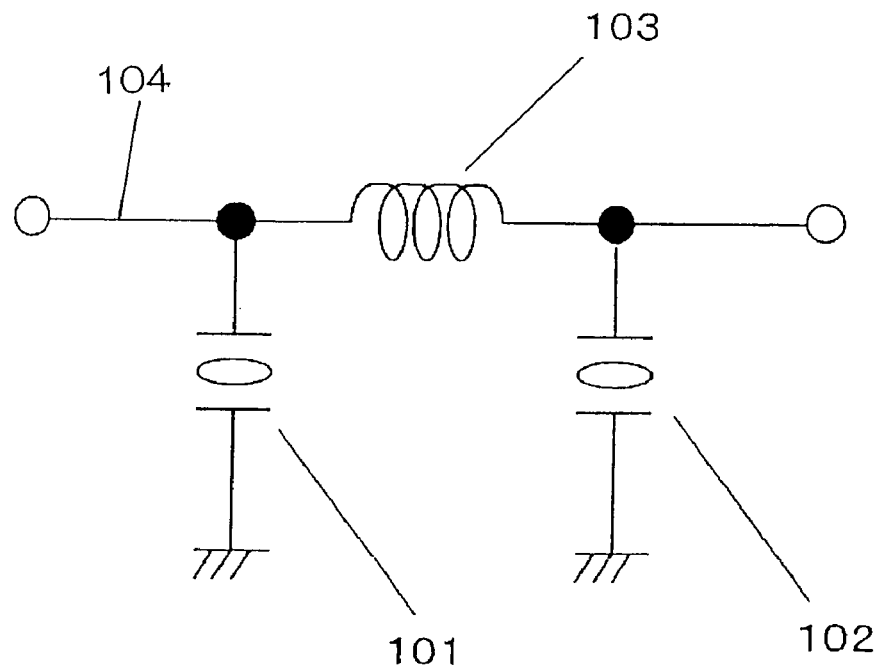
FIG. 1(a) shows a configuration of a surface acoustic wave filter according to an embodiment 1.
Figure 1B:
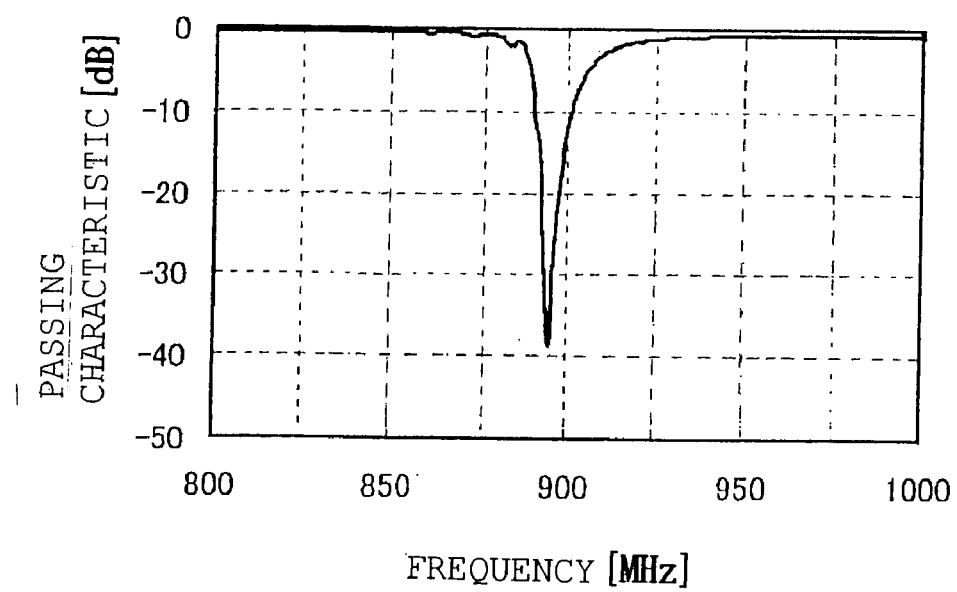
FIG. 1(b) shows a passing characteristic of the surface acoustic wave filter according to the embodiment 1.

FIG. 1 shows a configuration of the surface acoustic wave filter and a passing characteristic according to the embodiment 1. FIG. 1(a) shows the configuration of the surface acoustic wave filter and FIG. 1(b) shows the passing characteristic. As shown in FIG. 1(a), the surface acoustic wave filter has first and second surface acoustic wave resonators 101 and 102 as acoustic resonators of the present invention and an inductor 103 as a reactance element of the present invention, which couples the resonators with each other. As shown in FIG. 19(a), the surface acoustic wave resonators 101, 102 each have an IDT electrode formed on a piezoelectric substrate, which is equivalent to a piezoelectric substrate according to the present invention, and reflector electrodes disposed on both sides thereof.

More specifically, the surface acoustic wave resonators 101 and 102 each have one end grounded, and the other ends of the surface acoustic wave resonators are connected to a transmission line 104 at a predetermined interval, the transmission line 104 having signal input and output terminals. The inductor 103 is coupled in the predetermined interval between the ends connected to the transmission line 104.

FIG. 1(*b*) shows the passing characteristic in the vicinity of a frequency of 900 MHz provided when the inductance of the inductor 103 is set at about 8 nH in the configuration shown in FIG. 1(*a*). The maximum attenuation is about 38 dB, and a low loss can be attained over wide frequency bands lower and higher a stop band.

Figure 2:
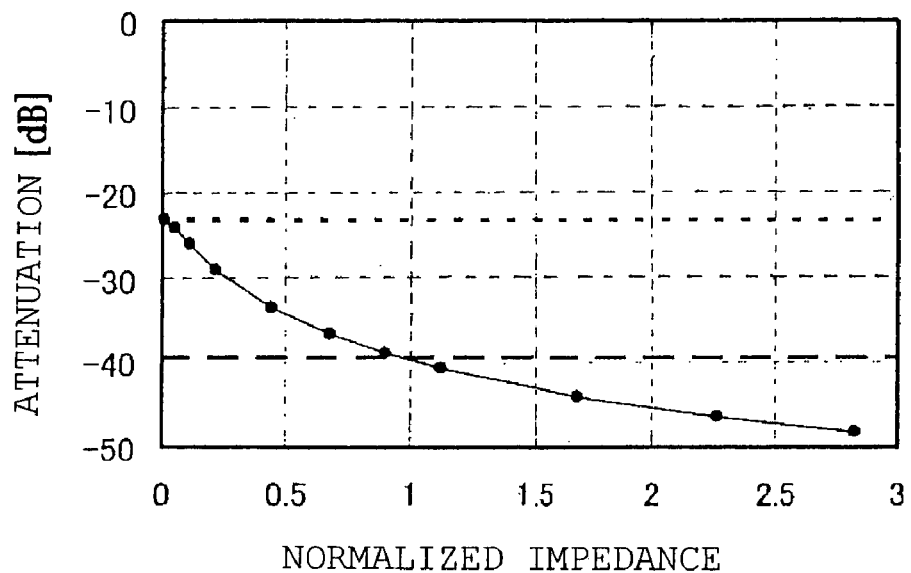
FIG. 2(a) shows a maximum attenuation with respect to a normalized impedance.
FIG. 2(b) shows an out-of-band loss with respect to the normalized impedance.
Figure 2:
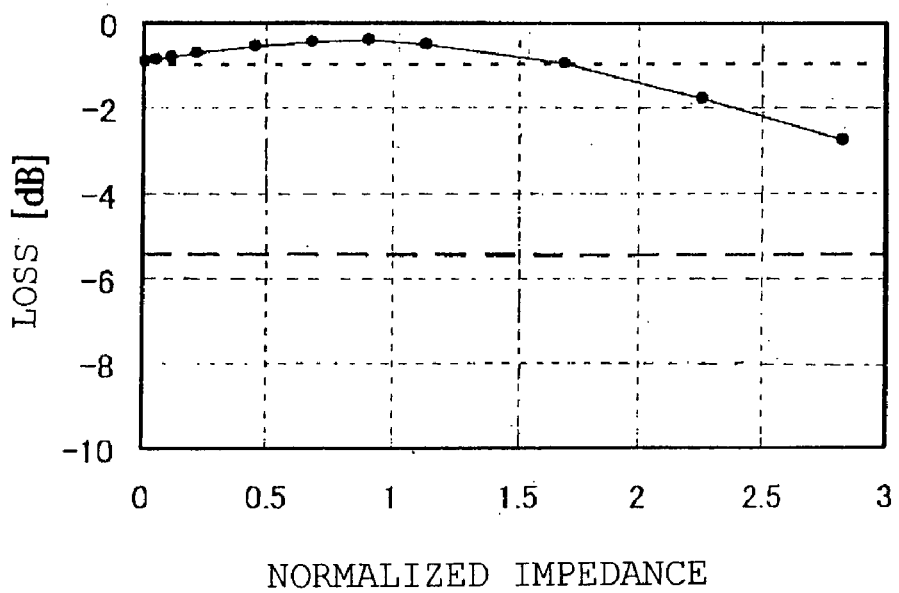

FIG. 2(*a*) shows a maximum attenuation with respect to a normalized impedance (ωL/Zo). Here, reference character Zo denotes a characteristic impedance, reference character ω denotes an angular frequency, and reference character L denotes an inductance. The characteristic impedance Zo is set at about 50 Ω. The solid line, the dashed line and the dotted line indicate the maximum attenuation plotted with respect to the impedance for the arrangement according to this embodiment, the maximum attenuation for the arrangement according to the conventional example 1 shown in FIG. 20 and the maximum attenuation for the arrangement according to the conventional example 2 shown in FIG. 21, respectively. FIG. 2(*b*) shows an out-of-band loss with respect to a normalized impedance. The solid line, the dashed line and the dotted line indicate the out-of-band loss plotted with respect to the normalized impedance for the arrangement according to this embodiment, the out-of-band loss for the arrangement according to the conventional example 1 shown in FIG. 20(*b*) and the out-of-band loss for the arrangement according to the conventional example 2 shown in FIG. 21(*b*), respectively. In the conventional example 1, while the in-band attenuation is higher than that in the conventional example 2, the out-of-band loss is also higher than that in the conventional example 2. In the conventional example 2, while the out-of-band loss is lower than that in the conventional example 1, the in-band attenuation is also lower than that in the conventional example 1.

In other words, both the characteristics of a higher attenuation within the attenuation band and a lower out-of band loss cannot be attained simultaneously.

As for the attenuation characteristic according to this embodiment, the attenuation is higher than that in the conventional example 2 shown in FIG. 21(*b*) over the whole range of Z/Zo, and is higher than that in the conventional example 1 shown in FIG. 20(*b*) within a range satisfying the relation of Z/Zo>1, and is higher than 40 dB. As for the loss characteristic according to this embodiment, the loss is improved over the whole range of Z/Zo compared to the conventional example 1 shown in FIG. 20(*b*), and is improved within a range satisfying the relation of Z/Zo<1.5 compared to the conventional example 2 shown in FIG. 21(*b*), and is equal to or less than about 1 dB. That is, within a range of Z between about Zo and 1.5Zo exclusive, both of the attenuation and the loss are improved compared to those in the conventional examples.

As described above, according to this embodiment, there can be provided a surface acoustic wave filter having bands top characteristics of a high attenuation and a low loss by coupling the two surface acoustic wave resonators with each other by the inductor as a reactance element.

While two surface acoustic wave resonators are used in this embodiment, three or more surface acoustic wave resonators may be used. In such a case, all the portions of the transmission line between the terminals of the surface acoustic wave resonators coupled thereto may have their respective inductors, or a part of them may have no inductor. It is essential only that at least one inductor is provided between the terminals, other than those grounded, of at least two surface acoustic wave resonators. In addition, in mounting, a serial circuit of a plurality of inductors, a parallel circuit of a plurality of inductors, or a combination thereof may be used. Furthermore, the configuration of the surface acoustic wave resonator itself is not limited to that described above.

The piezoelectric substrate in this embodiment may be a single crystal substrate, a substrate having a piezoelectric thin film formed thereon, a substrate having a dielectric thin film on a piezoelectric substrate. As far as the surface acoustic wave resonator constituting the surface acoustic wave filter has a characteristic that provides serial resonance and parallel resonance, the same effect as in this embodiment can be provided.

Embodiment 2

In the following, a surface acoustic wave filter according to an embodiment 2 of the present invention will be described with reference to the drawings.

The surface acoustic wave filter according to the embodiment 2 has the same configuration as that of the embodiment 1, except that the surface acoustic wave resonators 101 and 102 constituting the surface acoustic wave filter have different resonance frequencies. That is, the surface acoustic wave resonators 101 and 102 have different pitches of IDT electrodes, and as a result, they have different resonance frequencies and antiresonance frequencies.

Figure 3:
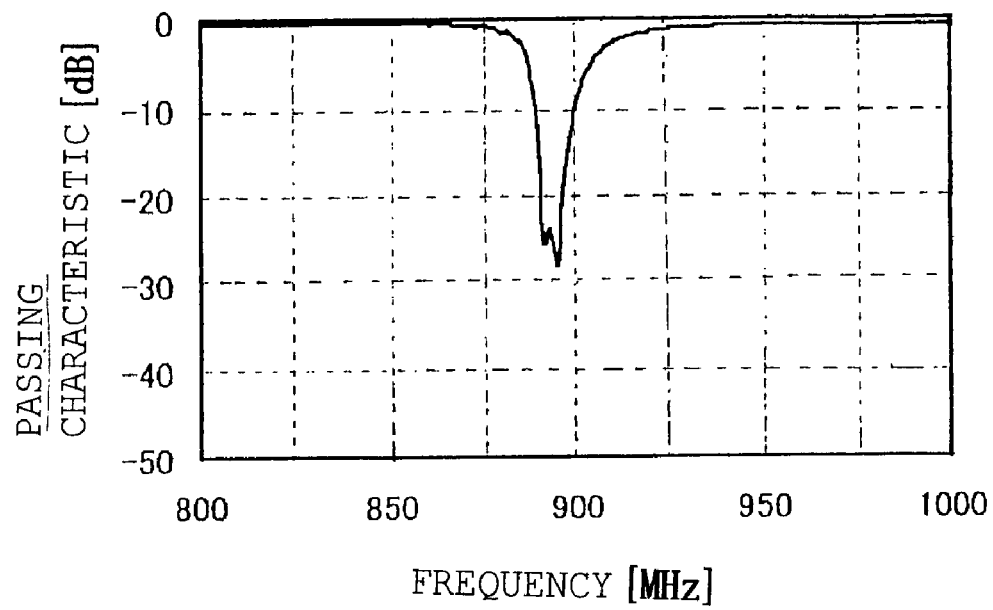
FIG. 3(a) shows a passing characteristic of a surface acoustic wave filter according to an embodiment 2.
FIG. 3(b) shows a passing characteristic in a conventional example 2 in the case where surface acoustic wave resonators have different resonance frequencies.
Figure 3:
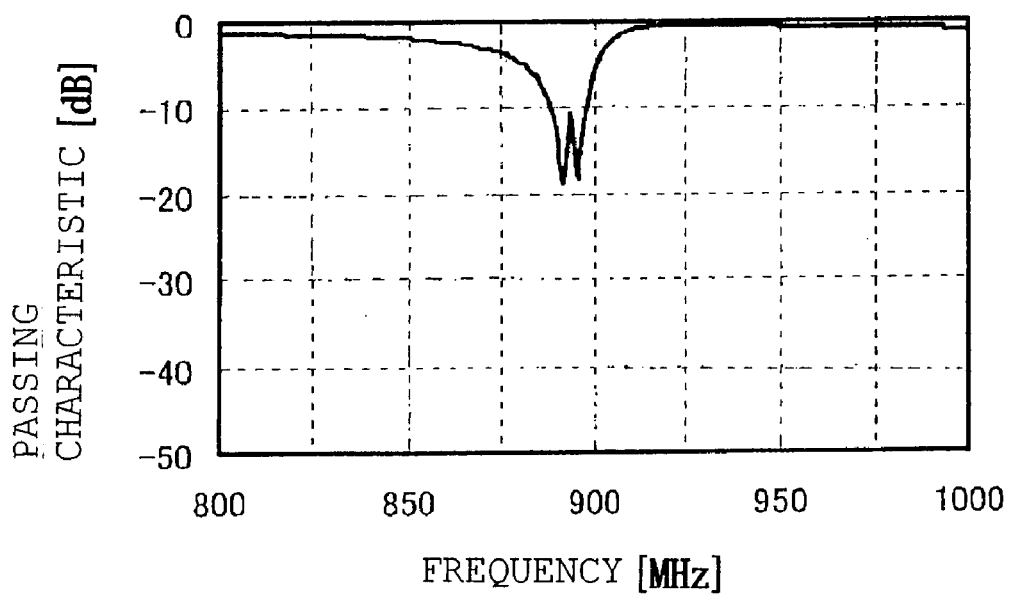

FIG. 3(*a*) shows a passing characteristic in the vicinity of a frequency of 900 MHz provided when the inductance value of the inductor is about 8 nH. For comparison, FIG. 3(*b*) shows a passing characteristic in the vicinity of a frequency of 900 MHz provided in the case where the two surface acoustic wave resonators 1901 and 1902 in the circuit in the conventional example 2 have different resonance frequencies. In this embodiment 2, the stop band is expanded because of the different resonance frequencies. Furthermore, the attenuation is increased and the loss is reduced on both sides of the attenuation band, compared to the passing characteristic in the conventional example 2 shown in FIG. 3(*b*).

As described above, according to this embodiment, there can be provided a surface acoustic wave filter having bandstop characteristics of a high attenuation, a wide stop band high and a low loss by coupling the two surface acoustic wave resonators having different resonance frequencies with each other by the inductor serving as a reactance element.

While two surface acoustic wave resonators are used in this embodiment, three or more surface acoustic wave resonators may be used. In such a case, the inductor(s) can be arranged in the same manner as in the embodiment 1. Furthermore, the configuration of the surface acoustic wave resonator is not limited to that described above.

The piezoelectric substrate in this embodiment may be a single crystal substrate, a substrate having a piezoelectric thin film formed thereon, a substrate having a piezoelectric substrate and a dielectric thin film formed thereon. As far as the surface acoustic wave resonator constituting the surface acoustic wave filter has a characteristic that provides serial resonance and parallel resonance, the same effect as in this embodiment can be provided.

Embodiment 3

In the following, a surface acoustic wave filter according to an embodiment 3 will be described with reference to the drawings.

Figure 4:
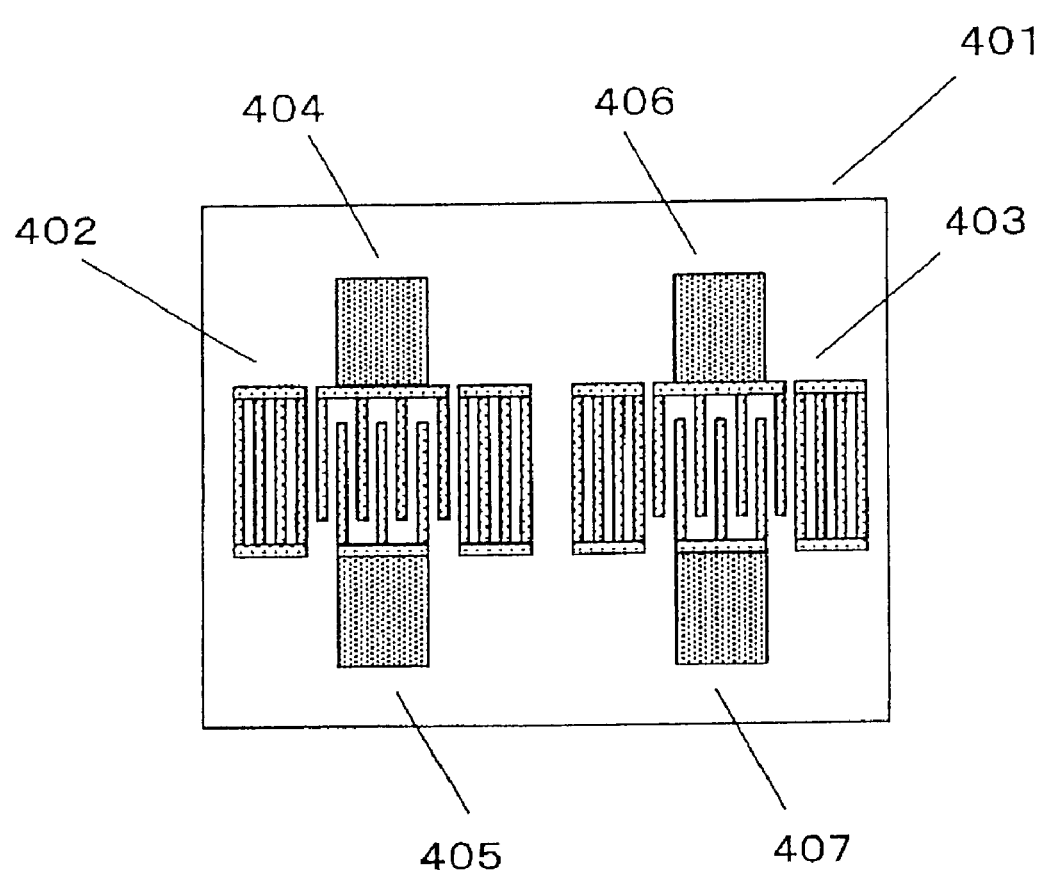
FIG. 4 shows a configuration of a surface acoustic wave filter according to an embodiment 3 on a piezoelectric substrate.

FIG. 4 shows a configuration of a part of the surface acoustic wave filter according to the embodiment 3 which is formed on a piezoelectric substrate. In FIG. 4, the part of the surface acoustic wave filter formed on the piezoelectric substrate is composed of first and second surface acoustic wave resonators 402 and 403 formed on a piezoelectric substrate 401, which is corresponding to the piezoelectric substrate of the present invention. An IDT electrode of the first surface acoustic wave resonator 402 is provided with electrode pads 404 and 405, and an IDT electrode of the second surface acoustic wave resonator 403 is provided with electrode pads 406 and 407.

Figure 5:
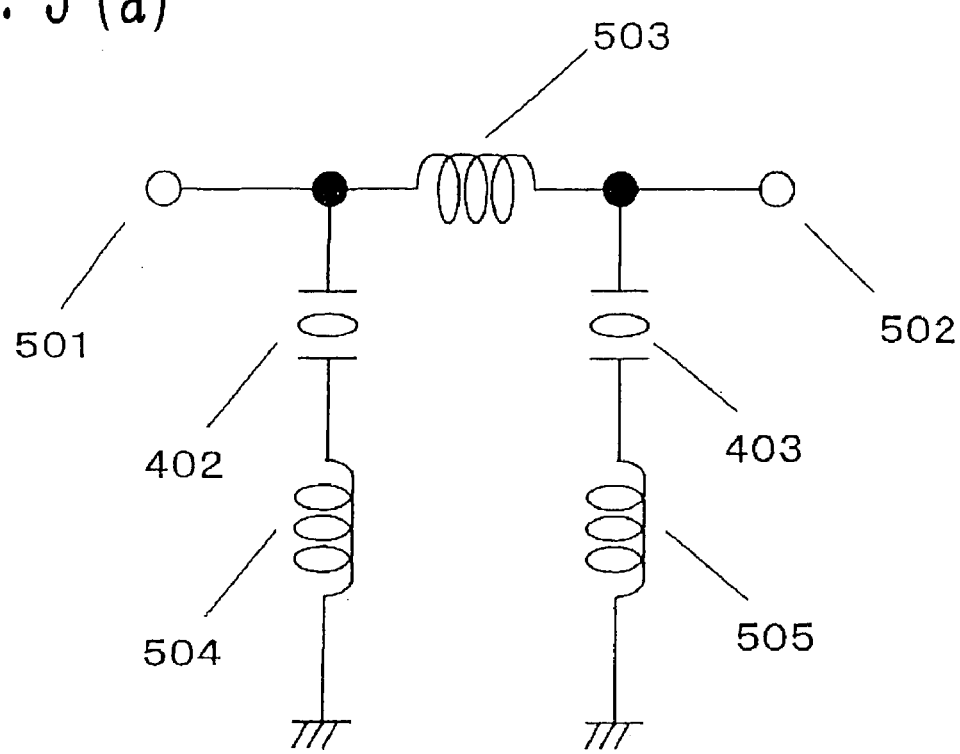
FIG. 5(a) shows a configuration of a surface acoustic wave filter according to an embodiment 3.
FIG. 5(b) shows a passing characteristic of the surface acoustic wave filter according to the embodiment 3.
Figure 5:
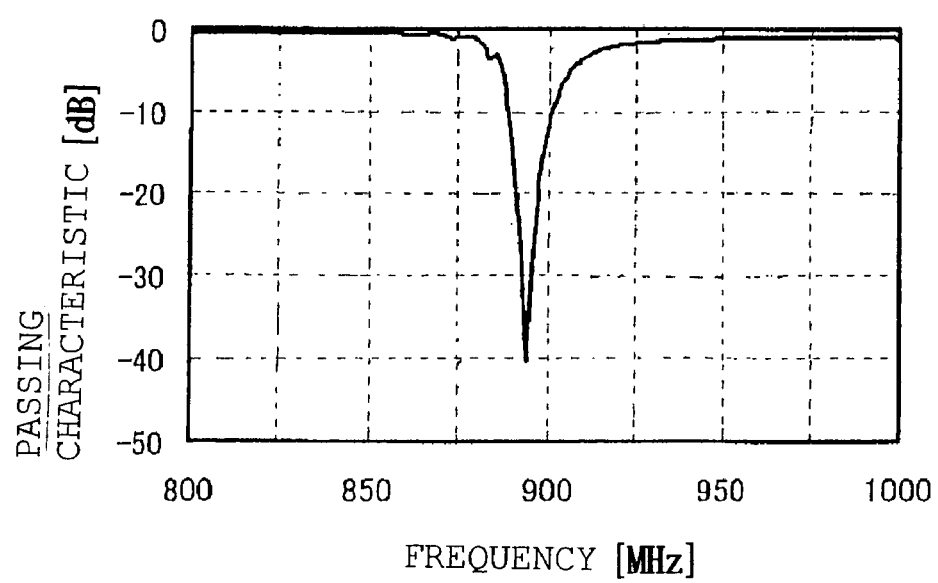

FIG. 5(a) shows a configuration of the whole of the surface acoustic wave filter, according to this embodiment. In the surface acoustic wave filter shown in FIG. 5(a), the electrode pad 404 of the first surface acoustic wave resonator 402 is coupled to an input terminal 501, and the electrode pad 406 of the second surface acoustic wave resonator 403 is coupled to an output terminal 502. In addition, an inductor 503 is disposed between the first and second surface acoustic wave resonators 402 and 403. The electrode pad 405 of the first surface acoustic wave resonator 402 is grounded via an inductance component 504, which is assumed to be a parasitic component, such as a wire or a wiring on the mounting substrate. The electrode pad 407 of the second surface acoustic wave resonator 403 is grounded via an inductance component 505, which is assumed to be a parasitic component, such as a wire or a wiring on the mounting substrate. That is, groundings of the surface acoustic wave resonators on the piezoelectric substrate 401 are provided separately and independently. That is, the surface acoustic wave resonators are prevented from having a common impedance, such as a wire or wiring on the mounting substrate, when the groundings thereof are drawn from the piezoelectric substrate 401. Herein, only the parasitic component at the time when the groundings are drawn is considered.

FIG. 5(b) shows a passing characteristic according to this embodiment. In FIG. 5(a), the inductor 503 has an inductance of about 10 nH, and the inductors 504, 505 serving as parasitic components have an inductance of about 1 nH.

Figure 6:
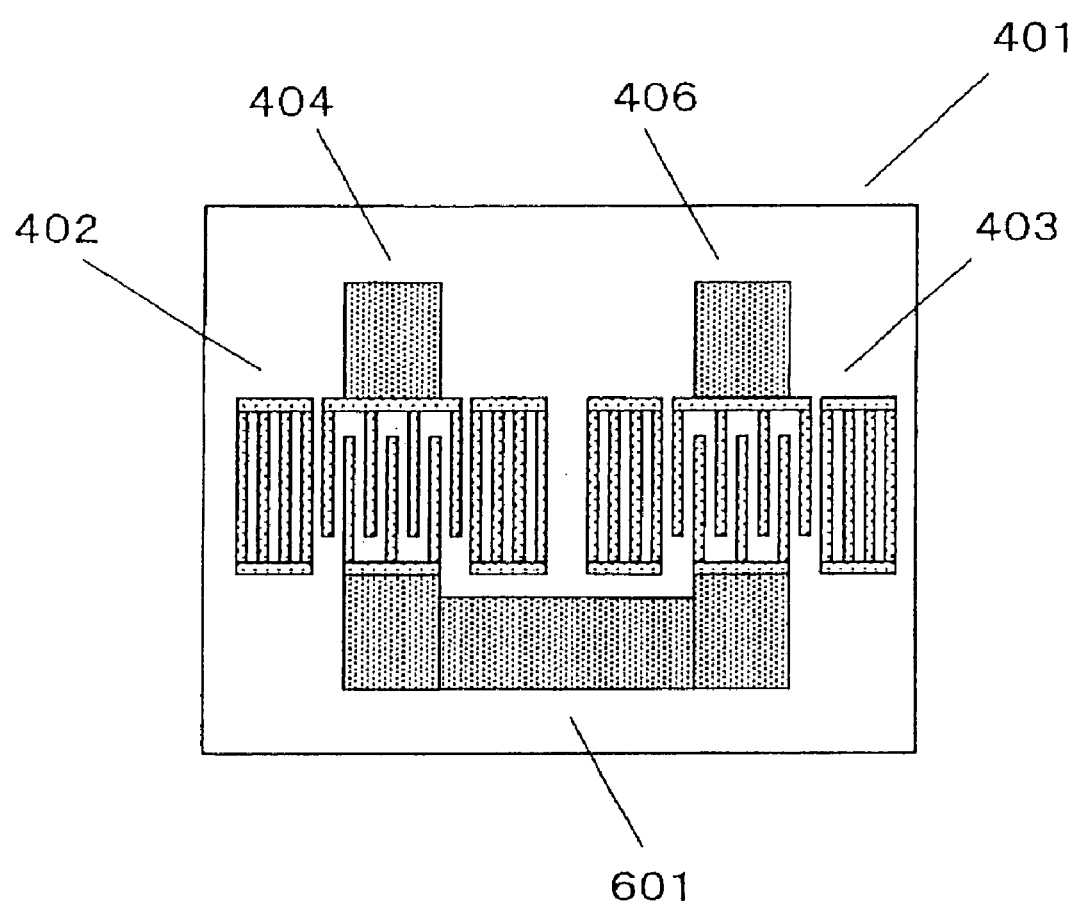
FIG. 6 shows a configuration of a surface acoustic wave filter on a piezoelectric substrate for comparison in the embodiment 3.
Figure 7:
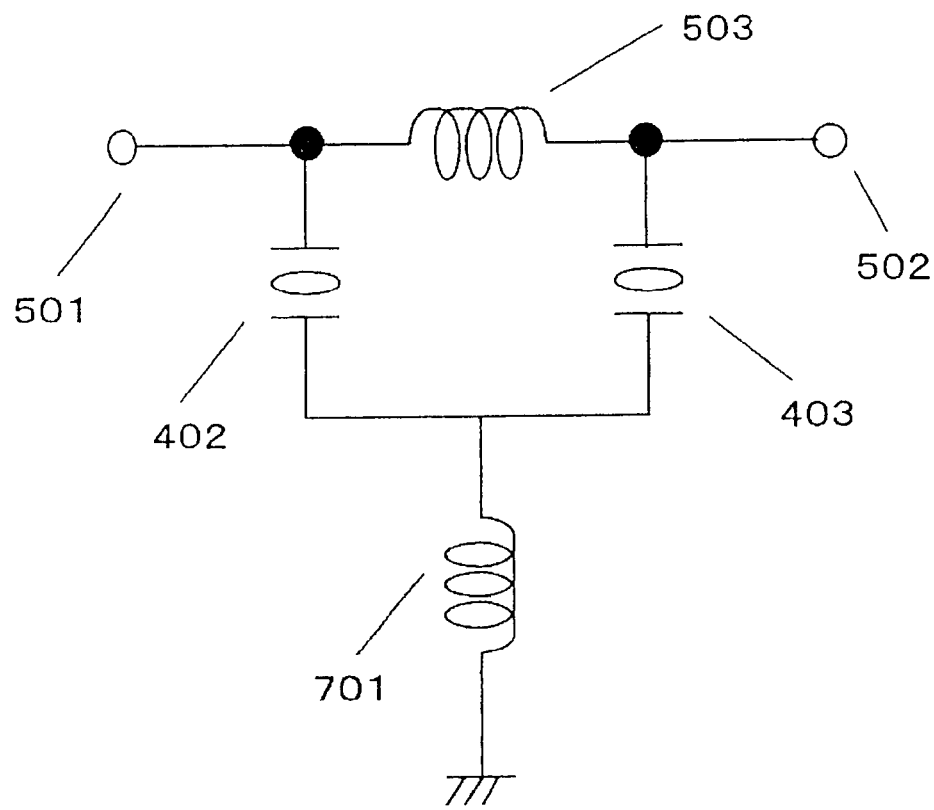
FIG. 7(a) shows a configuration of a surface acoustic wave filter for comparison in the embodiment 3.
FIG. 7(b) shows a passing characteristic of the surface acoustic wave filter for comparison in the embodiment 3.
Figure 7:
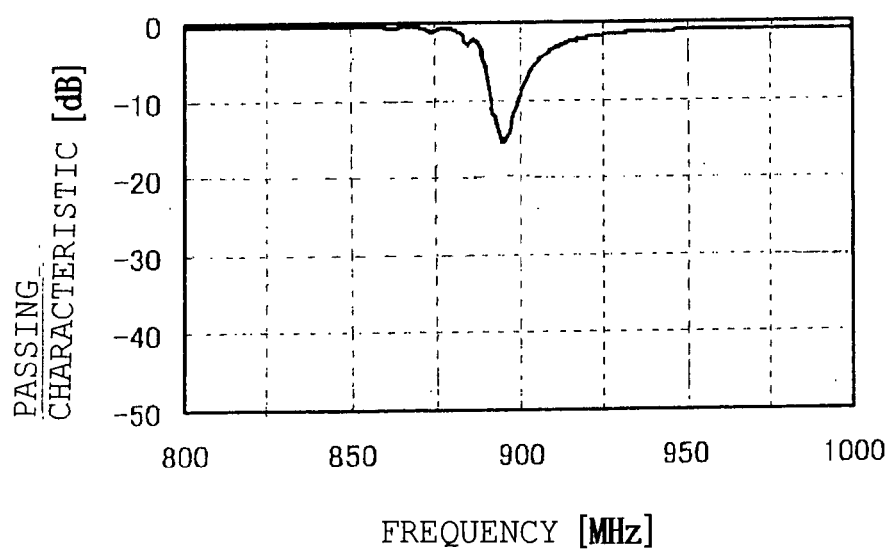

FIG. 6 shows an example for comparison, in which a common electrode pad 601 is coupled to the groundings of the first and second surface acoustic wave resonators 402, 403. That is, as shown in FIG. 7(a), a common electrode pad is coupled to the groundings of the surface acoustic wave resonators on the piezoelectric substrate and grounded via an inductor 701 which is assumed to be a parasitic component. FIG. 7(b) shows a characteristic thereof. Here, it is assumed that the inductor 701 has an inductance of 1 nH. From comparison of FIGS. 5(b) and 7(b), it can be seen that, in the passing characteristic in this embodiment, the attenuation is extremely increased. In other words, by providing the separate electrode pads coupled to the ground, that is, by grounding the surface acoustic wave resonators via the separate wirings at least on the piezoelectric substrate, the surface acoustic wave filters according to the embodiment 1 and 2 can be implemented without degrading the characteristics thereof.

Figure 8:
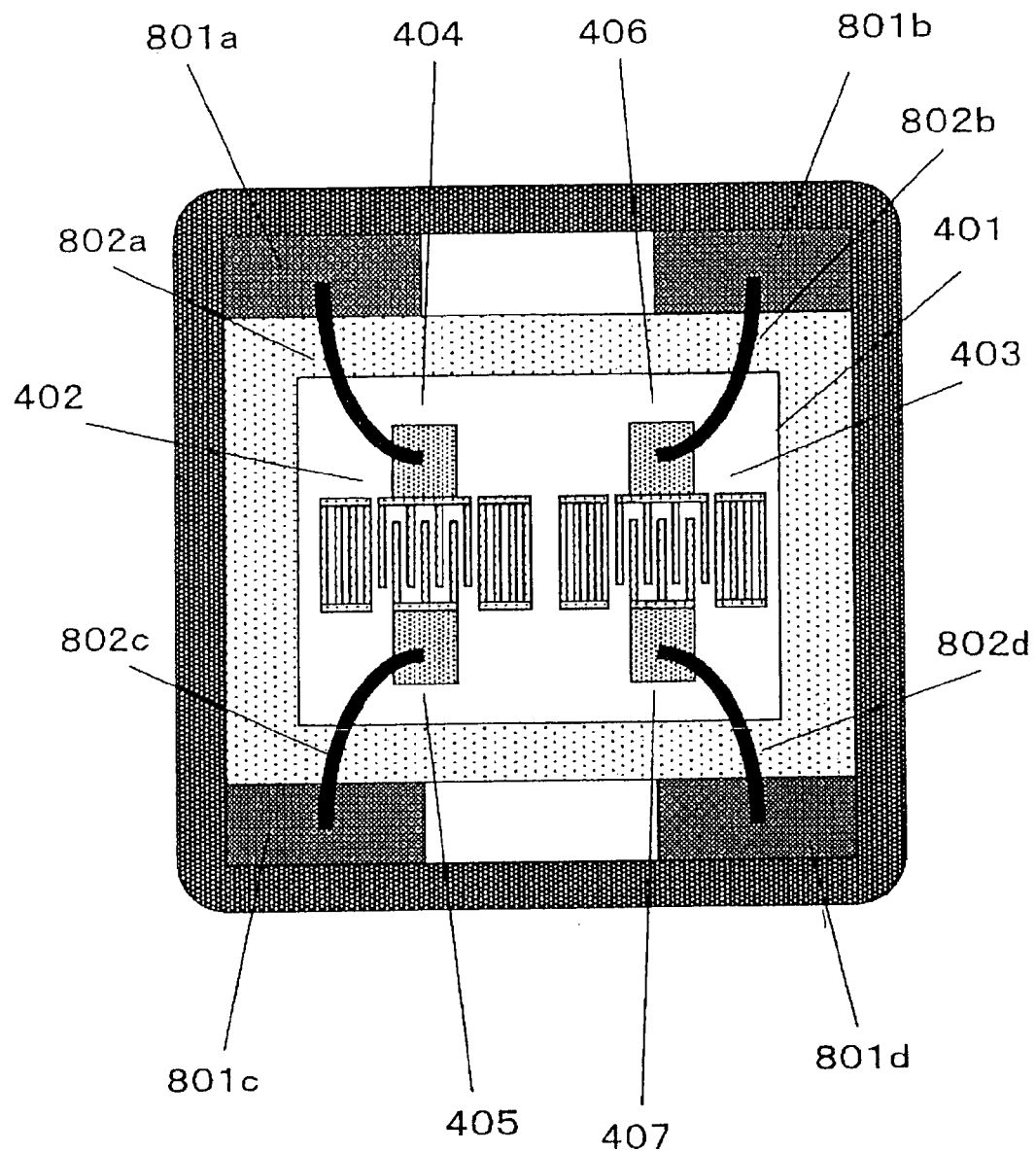
FIG. 8 shows a configuration of a surface acoustic wave filter that is wire-mounted.

In mounting, wire mounting or face down mounting may be used. For example, FIG. 8 shows a configuration of a surface acoustic wave filter that is wire-mounted, in which four electrode pads 404, 406, 405 and 407 are independently coupled to terminals 801a, 801b, 801c and 801d in the package via wires 802a, 802b, 802c and 802d, respectively. The inductor, which is to be disposed between surface acoustic wave resonators, is coupled between the terminals 801a and 801b. In addition, the terminals 801a and 801b are grounded inside or outside of the package.

Figure 9:
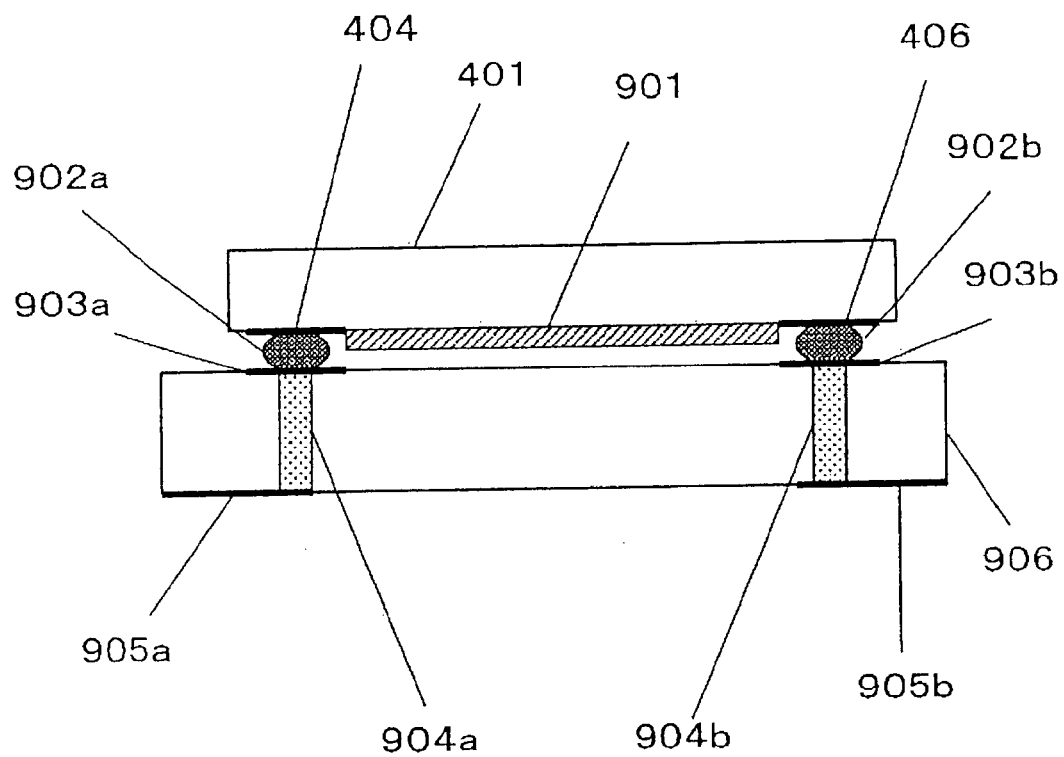
FIG. 9 shows a configuration of a surface acoustic wave filter that is face-down mounted.

FIG. 9 shows a configuration of a surface acoustic wave filter face-down mounted on a mounting substrate, in which electrode pads 404 and 406 on a piezoelectric substrate 401 having two surface acoustic wave resonators 901 formed thereon are coupled to pads 903a and 903b on a mounting substrate 906 via bumps 902a and 902b in a face-down manner, respectively. The pads 903a and 903b on the mounting substrate 906 are electrically coupled to external terminals 905a and 905b on the lower surface of the substrate through via holes 904a and 904b, respectively. In addition, although not shown, electrode pads 405 and 407 are also coupled to the mounting substrate 906 and grounded in the same manner.

As described above, according to this embodiment, there can be provided a surface acoustic wave filter having bandstop characteristics of a high attenuation and a low loss by providing the separate electrode pads to be grounded for the two surface acoustic wave resonators on the piezoelectric substrate.

While two surface acoustic wave resonators are used in this embodiment, three or more surface acoustic wave resonators may be used as in the embodiment 1. Furthermore, the configuration of the surface acoustic wave resonator is not limited to that described above.

The piezoelectric substrate in this embodiment may be a single crystal substrate, a substrate having a piezoelectric thin film formed thereon, a substrate having a piezoelectric substrate and a dielectric thin film formed thereon. As far as the surface acoustic wave resonator constituting the surface acoustic wave filter has a characteristic that provides serial resonance and parallel resonance, the same effect as in this embodiment can be provided.

Embodiment 4

In the following, a surface acoustic wave filter according to an embodiment 4 of the present invention will be described with reference to the drawings.

Figure 10:
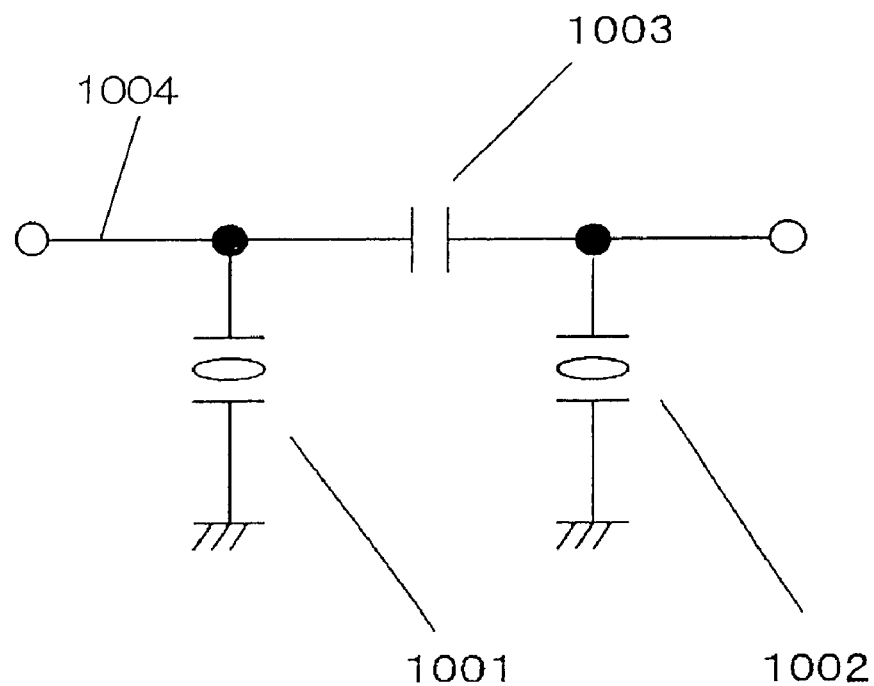
FIG. 10(a) shows a configuration of a surface acoustic wave filter according to an embodiment 4.
FIG. 10(b) shows a passing characteristic of the surface acoustic wave filter according to the embodiment 4.
Figure 10:
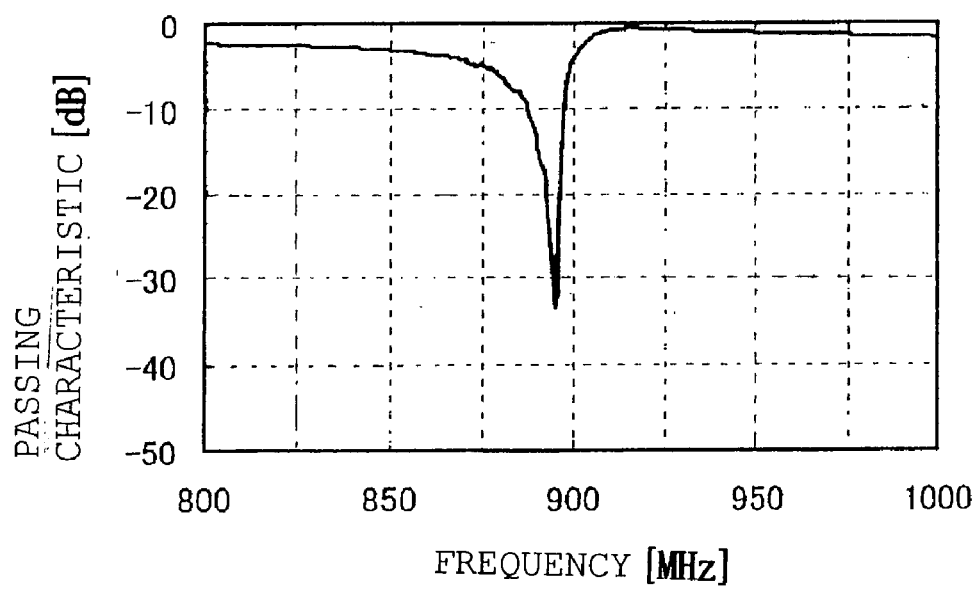

FIGS. 10(a) and 10(b) show a configuration of the surface acoustic wave filter and a passing characteristic according to the embodiment 4. FIG. 10(a) shows the configuration of the surface acoustic wave filter and FIG. 10(b) shows the passing characteristic. As shown in FIG. 10(a), the surface acoustic wave filter has first and second surface acoustic wave resonators 1001 and 1002 and a capacitor 1003 serving as a reactance element that couples the resonators with each other.

More specifically, the surface acoustic wave resonators 1001 and 1002 each have one end grounded, and the other ends of the surface acoustic wave resonators are connected to a transmission line 1004 at a predetermined interval, the transmission line 1004 having signal input and output terminals. The capacitor 1003 is coupled in the predetermined interval between the ends connected to the transmission line 1004. As shown in FIG. 19(a), the surface acoustic wave resonators 1001 and 1002 each have an IDT electrode formed on a piezoelectric substrate and reflector electrodes disposed on both sides thereof.

FIG. 10(b) shows the passing characteristic in the vicinity of a frequency of 900 MHz provided when the capacitance of the capacitor 1003 is set at 8 pF. Compared to the passing characteristic in the conventional example 2 shown in FIG. 21(*b*), the attenuation is enhanced.

Figure 11:
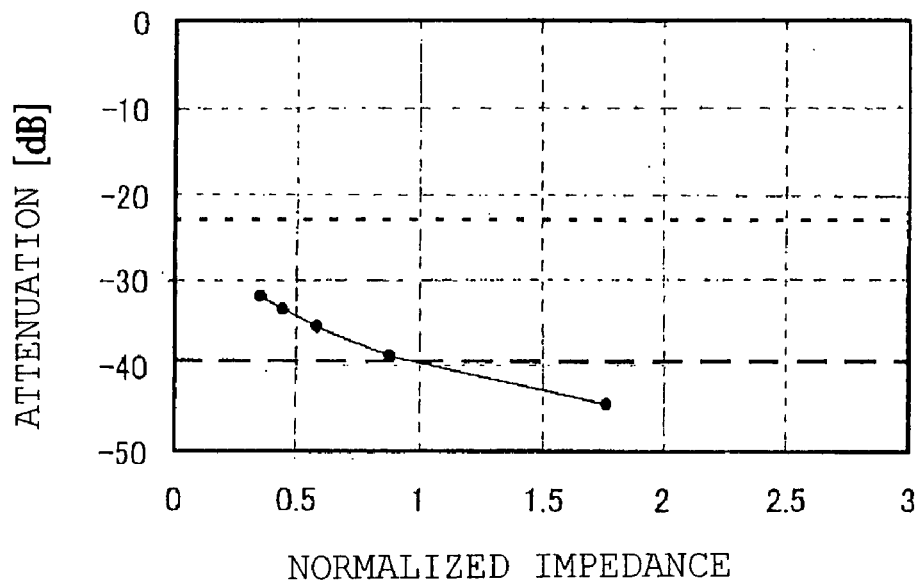
FIG. 11(a) shows a maximum attenuation with respect to a normalized impedance.
FIG. 11(b) shows an out-of-band loss with respect to the normalized impedance.
Figure 11:
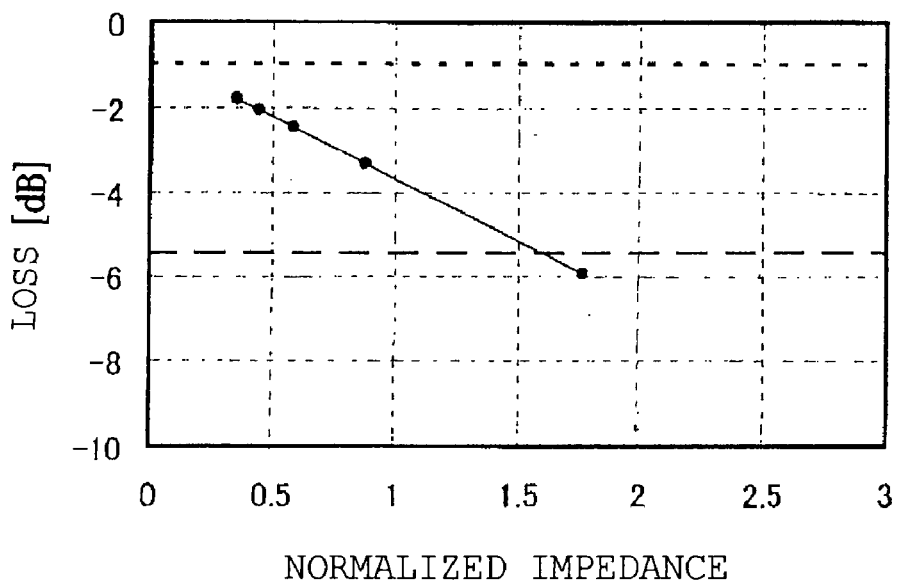

FIG. 11(*a*) shows a maximum attenuation with respect to a normalized impedance ($Z=1/\omega CZo$). Here, reference character Zo denotes a characteristic impedance, reference character $\omega$ denotes an angular frequency, and reference character C denotes a capacitance. The characteristic impedance Zo is set at about 50 $\Omega$. The solid line, the dashed line and the dotted line indicate the maximum attenuation with respect to the normalized impedance for the arrangement according to this embodiment, the maximum attenuation for the arrangement according to the conventional example 1 shown in FIG. 20(*b*) and the maximum attenuation for the arrangement according to the conventional example 2 shown in FIG. 21(*b*), respectively. As for the attenuation characteristic according to this embodiment, compared to the conventional example 1 shown in FIG. 20(*b*), the attenuation is increased within a range satisfying the relation of $Z/Zo>1$, and compared to the conventional example 2 shown in FIG. 21(*b*), the attenuation is increased over the whole range of $Z/Zo$. FIG. 11(*b*) shows an out-of-band loss with respect to the normalized impedance. Compared to the conventional example 1 shown in FIG. 20(*b*), the loss is improved within a range satisfying the relation of $Z/Zo<1.5$.

As described above, according to this embodiment, there can be provided a surface acoustic wave filter having bandstop characteristics of a high attenuation and a low loss by coupling the two surface acoustic wave resonators with each other by the capacitor serving as a reactance element.

While two surface acoustic wave resonators are used in this embodiment, three or more surface acoustic wave resonators may be used. In such a case, the capacitor (s) can be arranged in the same manner as the inductor(s) in the embodiment 1. In addition, in mounting, a serial circuit of a plurality of capacitors, a parallel circuit of a plurality of capacitors, or a combination thereof may be used. Furthermore, the configuration of the surface acoustic wave resonator itself is not limited to that described above.

The piezoelectric substrate in this embodiment may be a single crystal substrate, a substrate having a piezoelectric thin film formed thereon, a substrate having a dielectric thin film on a piezoelectric substrate. As far as the surface acoustic wave resonator constituting the surface acoustic wave filter has a characteristic that provides serial resonance and parallel resonance, the same effect as in this embodiment can be provided.

Figure 12:
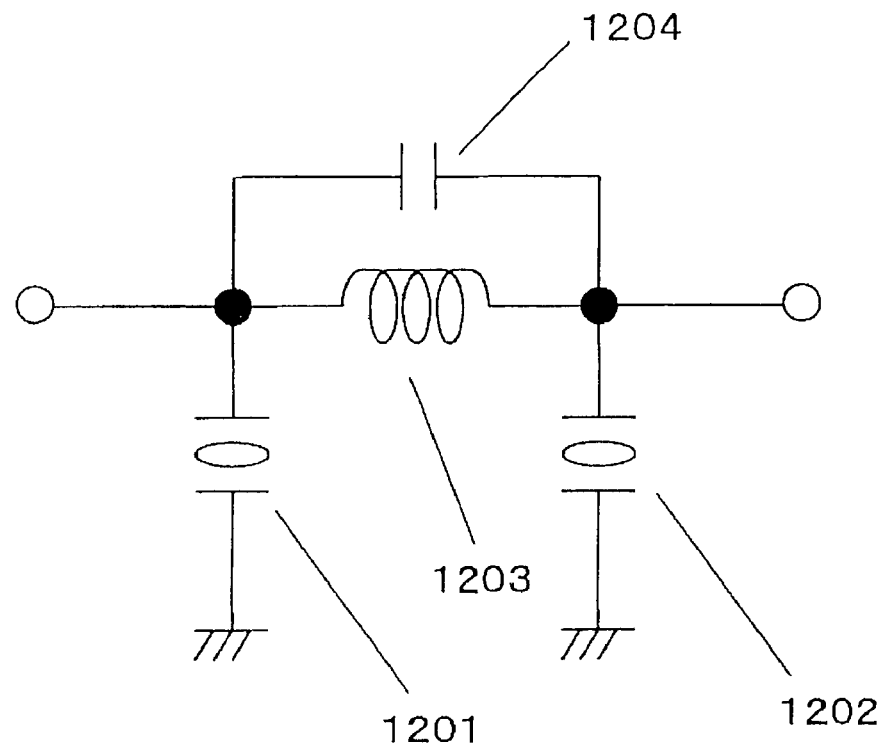
FIG. 12(a) shows a configuration of a surface acoustic wave filter using a parallel circuit of a capacitor and an inductor as a reactance element.
FIG. 12(b) shows a configuration of a surface acoustic wave filter using a serial circuit of a capacitor and an inductor as a reactance element.
Figure 12:
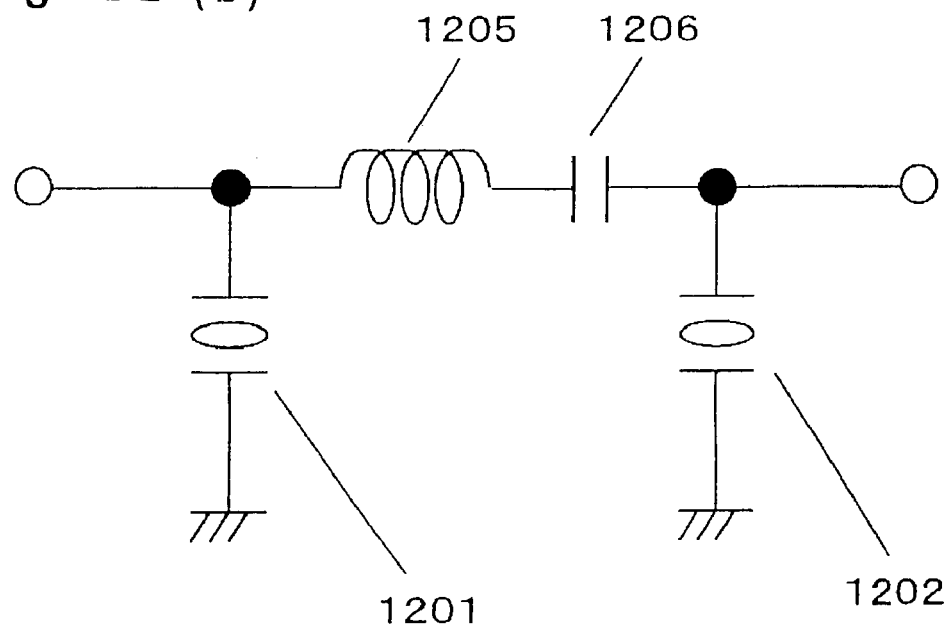

In the embodiments 1 to 4 described above, the inductor or capacitor is used as the reactance element to couple the two surface acoustic wave resonators with each other. However, a parallel circuit of an inductor and a capacitor or a serial circuit thereof may be used as shown in FIG. 12. FIGS. 12(*a*) and 12(*b*) show a parallel circuit of an inductor and a capacitor and a serial circuit thereof, respectively. In FIG. 12(*a*), a surface acoustic wave resonators 1201 and 1202 are coupled to each other via a parallel circuit of a capacitor 1204 and an inductor 1203. In FIG. 12(*b*), the surface acoustic wave resonators 1201 and 1202 are coupled to each other via a serial circuit of the capacitor 1206 and the inductor 1205. Of course, a plurality of capacitors or inductors may be mounted.

While two surface acoustic wave resonators are used in this embodiment, three or more surface acoustic wave resonators may be used. In such a case, the serial circuit or parallel circuit can be disposed in the same manner as the inductors in the embodiment 1.

Embodiment 5

In the following, a surface acoustic wave filter according to an embodiment 5 of the present invention will be described with reference to the drawings.

Figure 13:
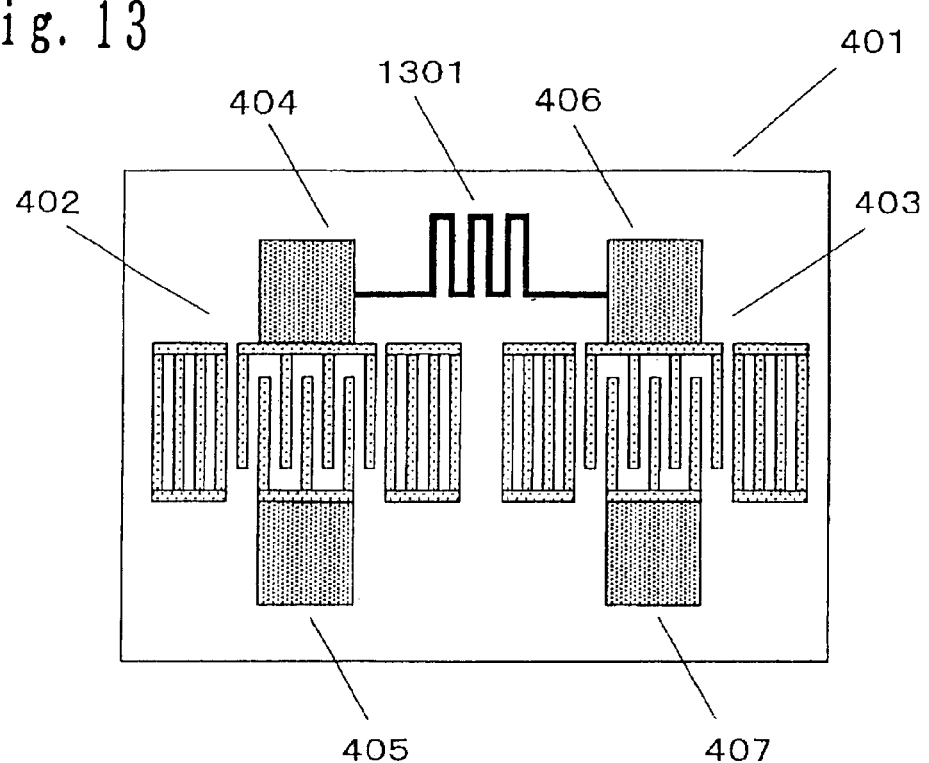
FIG. 13 shows a configuration of a surface acoustic wave filter according to an embodiment 5 on a piezoelectric substrate.

FIG. 13 shows a configuration of the surface acoustic wave filter according to the embodiment 5 on a piezoelectric substrate. In FIG. 13, the surface acoustic wave filter comprises first and second surface acoustic wave resonators 402 and 403 formed on a piezoelectric substrate 401, which is corresponding to the piezoelectric substrate according to the present invention. An IDT electrode of the first surface acoustic wave resonator 402 is provided with electrode pads 404 and 405, and an IDT electrode of the second surface acoustic wave resonator 403 is provided with electrode pads 406 and 407. In addition, an inductor 1301 formed on the piezoelectric substrate is coupled between the electrode pads 404 and 406. In this case, the inductor 1301 can be formed simultaneously with film deposition and patterning of the surface acoustic wave resonators. In addition, the electrode pads 404, 406 are coupled to input and output terminals, and the electrode pads 405, 407 are grounded. Such an arrangement can eliminate the need of connection of the inductor outside the package, thereby realizing downsizing.

Figure 14:
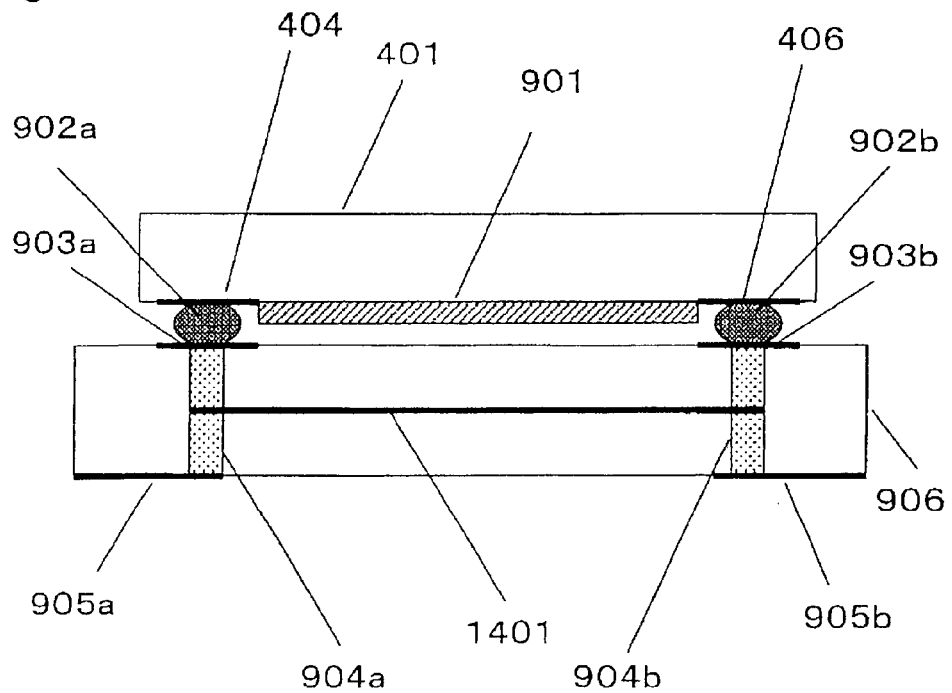
FIG. 14 shows a configuration of the surface acoustic wave filter according to the embodiment 5 mounted on a mounting substrate.

In addition, the inductor coupling the two surface acoustic wave resonators may be formed in a mounting substrate, which is previously formed by laminating dielectric layers, and then the piezoelectric substrate having the surface acoustic wave resonators formed thereon may be face-down mounted on the mounting substrate. FIG. 14 shows a configuration of a surface acoustic wave filter face-down mounted on a mounting substrate, in which electrode pads 404 and 406 on a piezoelectric substrate 401 having two surface acoustic wave resonators 901 formed thereon are coupled to pads 903*a* and 903*b* on a mounting substrate 906 via bumps 902*a* and 902*b* in a face-down manner, respectively. The pads 903*a* and 903*b* on the mounting substrate 906 are electrically coupled to external terminals 905*a* and 905*b* on the lower surface of the substrate through via holes 904*a* and 904*b*, respectively. In addition, although not shown, electrode pads 405 and 407 are also coupled to the mounting substrate and grounded in the same manner. An inductor 1401 is formed by an internal layer pattern of the mounting substrate 906 and electrically coupled between the input and output terminals of the filter, that is, between the surface acoustic wave resonators. In this case, the inductor 1401 can be formed on a larger area, and thus, a higher inductance can be provided. Alternatively, the inductor 1401 may be formed on the surface of the mounting substrate.

As described above, in the surface acoustic wave filter according to this embodiment, the inductor coupling the two surface acoustic wave resonators is formed on the piezoelectric substrate or in the mounting substrate, and therefore, downsizing of the surface acoustic wave filter can be attained.

While two surface acoustic wave resonators are used in this embodiment, three or more surface acoustic wave resonators may be used as in the embodiments 1 to 4. Furthermore, the configuration of the surface acoustic wave resonator is not limited to that described above.

The piezoelectric substrate in this embodiment may be a single crystal substrate, a substrate having a piezoelectric thin film formed thereon, a substrate having a dielectric thin film on a piezoelectric substrate. As far as the surface acoustic wave resonator constituting the surface acoustic wave filter has a characteristic that provides serial resonance and parallel resonance, the same effect as in this embodiment can be provided.

In addition, in this embodiment described above, the inductor is formed in an internal layer of the mounting substrate. However, it may be formed in the package.

In addition, while the inductor is formed on the piezoelectric substrate or in the mounting substrate, a wire used in wire mounting may be used to serve as an inductance component.

In this embodiment, while a method of forming the surface acoustic wave filter using an inductor as a reactance element has been described, a capacitor or a combination of an inductor and a capacitor may be used as the reactance element.

Embodiment 6

In the following, a band elimination filter according to an embodiment 6 of the present invention will be described with reference to the drawings.

Figure 15:
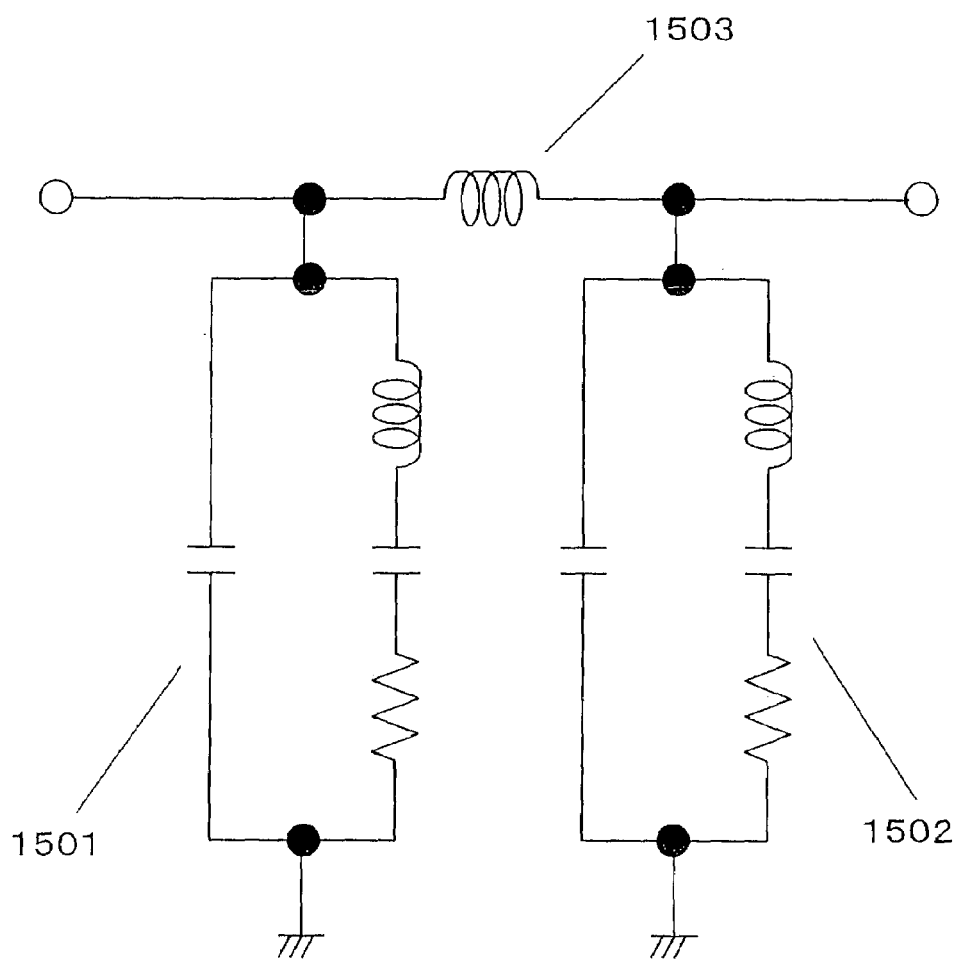
FIG. 15 is an equivalent circuit diagram of a band elimination filter according to an embodiment 6.

FIG. 15 shows an equivalent circuit diagram of the band elimination filter according to the embodiment 6. In the embodiments described above, the band elimination filter according to the present invention is a surface acoustic wave filter having a surface acoustic wave resonator as an acoustic resonator. However, in this embodiment, two acoustic resonators are piezoelectric resonators of a bulk wave type, rather than the resonators of the surface acoustic wave type.

In FIG. 15, the band elimination filter comprises first and second piezoelectric resonators 1501 and 1502 and an inductor 1503 serving as a reactance element. The first and second piezoelectric resonators 1501 and 1502 have characteristics that provide serial resonance and parallel resonance, and the equivalent circuit of the piezoelectric resonator is the same as that of the surface acoustic wave resonator. That is, concerning the operation of the resonator, the piezoelectric resonator is the same as the surface acoustic wave resonator, and coupling such piezoelectric resonators using the inductor can provide a band elimination filter with a low loss and a high attenuation. For example, piezoelectric resonators having such characteristics include a bulk wave resonator using a piezoelectric thin film and a bulk wave resonator using a single crystal. In such bulk wave resonators, the frequency range that can be provided is limited. However, the Q value of the resonator can be improved by appropriately selecting the piezoelectric material, and the resonator can have a lower loss and a higher attenuation than those of the surface acoustic wave resonator. Besides, the normalized impedance of the reactance element as well as the characteristic impedance of the equivalent circuit is set, whereby the bulk wave resonator can be optimized in the same manner as the surface acoustic wave resonator.

Figure 16:
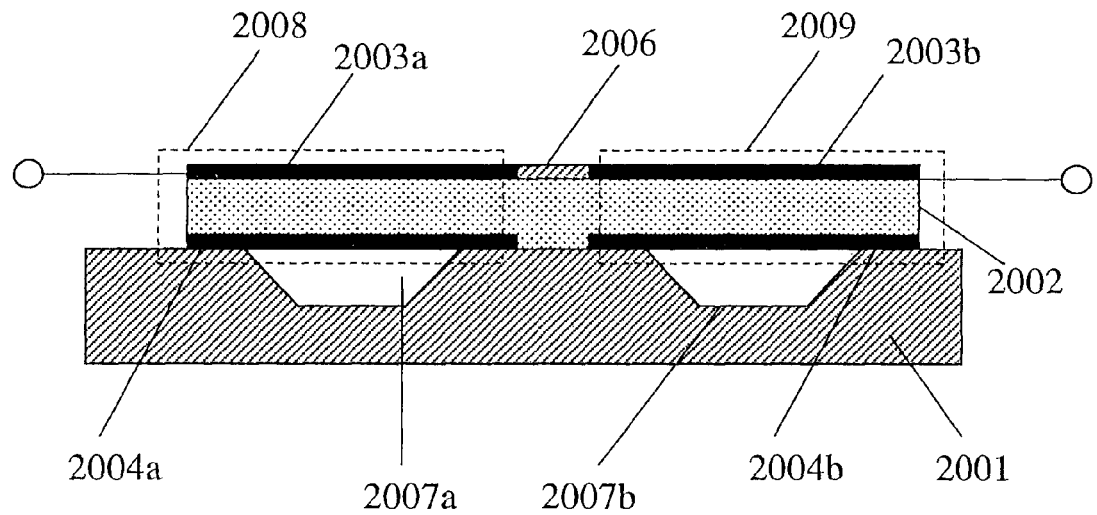
FIG. 16(a) shows a specific configuration of the band elimination filter according to the embodiment 6.
FIG. 16(b) shows another specific configuration of the band elimination filter according to the embodiment 6.
Figure 16:
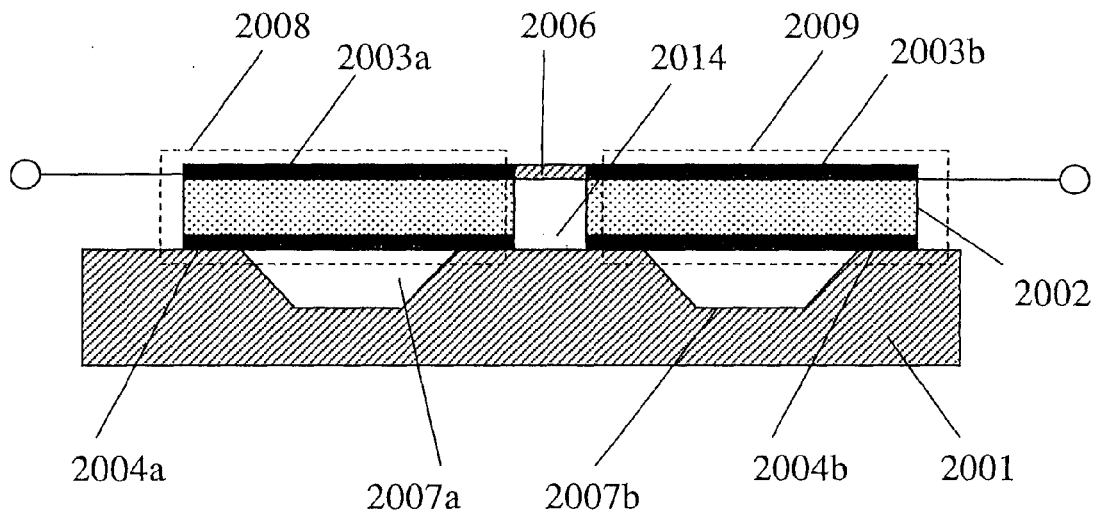

FIG. 16(*a*) shows a specific configuration of a band elimination filter using a bulk wave type piezoelectric resonator. The band elimination filter comprises a substrate 2001 and a piezoelectric layer 2002 having resonator electrodes on both principal planes thereof, the piezoelectric layer being provided on the substrate 2001 and being corresponding to the piezoelectric layer according to the present invention.

In addition, an upper electrode 2003*a* and a lower electrode 2003*b* are provided on the upper principal plane of the piezoelectric layer 2002 at a predetermined interval. A lower electrode 2004*a* and a lower electrode 2004*b* are provided on the lower principal plane of the piezoelectric layer at positions opposite to the upper electrode 2003*a* and the upper electrode 2003*b*, respectively. The lower electrodes 2004*a* and 2004*b* are independently grounded, and the upper electrodes 2003*a* and 2003*b* are coupled to signal input and output terminals. In addition, an inductor 2006, which connects the upper electrodes 2003*a* and 2003*b* to each other, is provided over the predetermined interval between the upper electrodes 2003*a* and 2003*b*. The upper and lower electrodes may be formed by patterning a material, such as molybdenum, aluminum and platinum.

On the other hand, depressions are formed in the surface of the substrate 2001 which is in contact with the lower electrodes 2004*a* and 2004*b*, and the depressions constitute cavities 2007*a* and 2007*b*.

In this configuration, the upper electrode 2003*a*, the lower electrode 2004*a*, the part of the piezoelectric layer 2002 sandwiched between the upper electrode 2003*a* and the lower electrode 2004*a*, and the part of the substrate 2001 which constitutes the cavity 2007*a* constitute a first resonator 2008, which is corresponding to the piezoelectric resonator 1501. Besides, the upper electrode 2003*b*, the lower electrode 2004*b*, the part of the piezoelectric layer 2002 sandwiched between the upper electrode 2003*b* and the lower electrode 2004*b*, and the part of the substrate 2001 which constitutes the cavity 2007*b* constitute a second resonator 2009, which is corresponding to the piezoelectric resonator 1502. The inductor 2006 is corresponding to the inductor 1503 and formed by patterning the electrode, for example.

FIG. 16(*b*) shows another example of specific configuration of a band elimination filter using a bulk wave type piezoelectric resonator. Parts identical to or corresponding to those in FIG. 16(*a*) are assigned the same reference numerals, and detailed description thereof will be omitted. In the example shown in FIG. 16(*b*), a dielectric layer 2014 is formed directly below the inductor instead of the piezoelectric layer 2002. This can improve the isolation between the resonators.

As described above, according to this embodiment, there can be provided a band elimination filter having bandstop characteristics of a high attenuation and a low loss by coupling the two piezoelectric resonators with each other by the inductor serving as a reactance element.

While two piezoelectric resonators are used in this embodiment, three or more piezoelectric resonators may be used. In such a case, all the portions between the upper electrodes may have their respective inductors, or a part of them may have no inductor. It is essential only that at least one inductor is provided between the electrodes, other than those grounded, of at least two piezoelectric resonators. In addition, in mounting, a serial circuit of a plurality of inductors, a parallel circuit of a plurality of inductors, or a combination thereof may be used. Furthermore, the configuration of the piezoelectric resonator itself is not limited to that described above.

While the inductor is used as a reactance element in the above description, a capacitor may be used.

Figure 17:
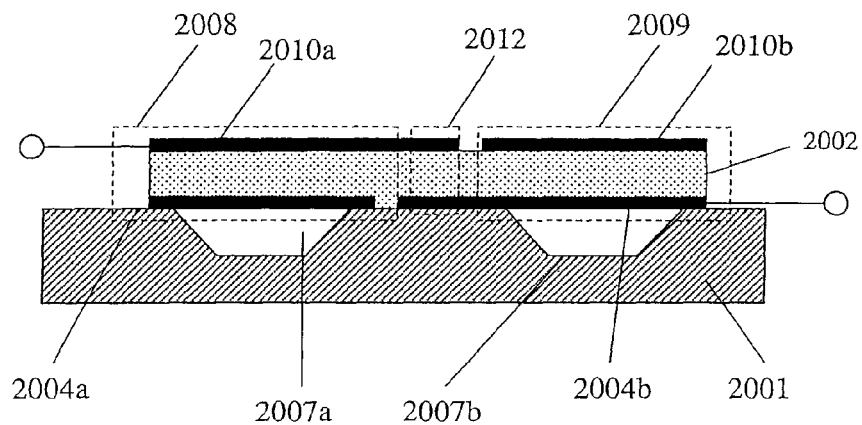
FIG. 17(a) shows a specific configuration of the band elimination filter according to the embodiment 6.
FIG. 17(b) shows another specific configuration of the band elimination filter according to the embodiment 6.
FIG. 17(c) shows another specific configuration of the band elimination filter according to the embodiment 6.
Figure 17:
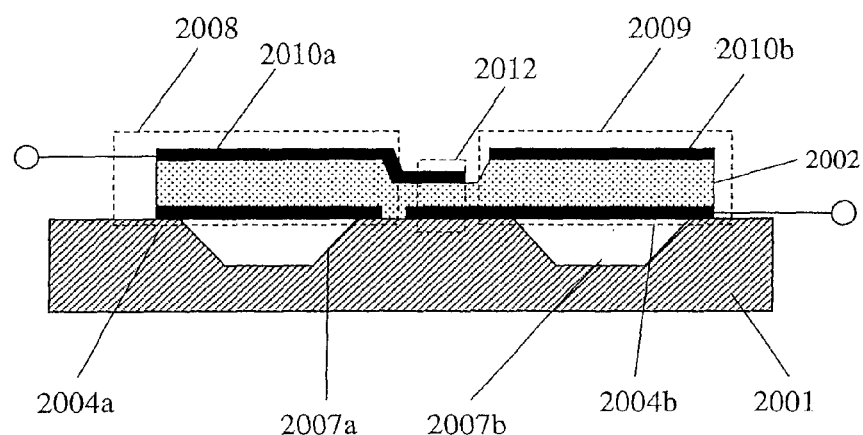
Figure 17:
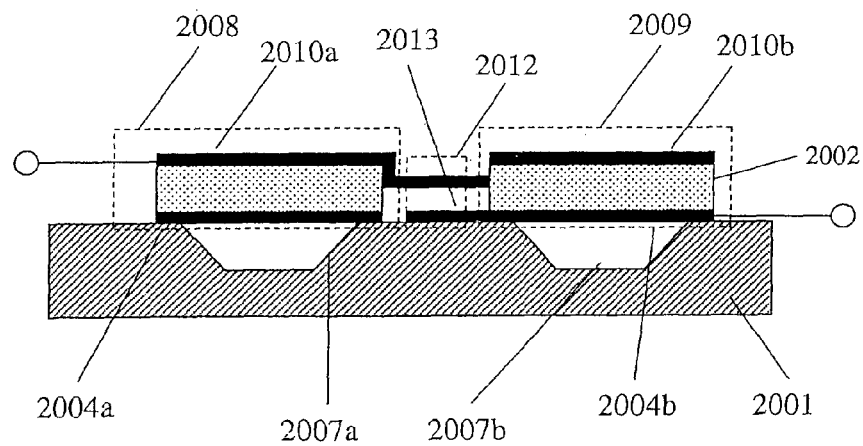

FIGS. 17(*a*) to 17(*c*) show specific configurations of a band elimination filter using piezoelectric resonators having a capacitor as a reactance element. Parts identical to or corresponding to those shown in FIGS. 16(*a*) and 16(*b*) are assigned the same reference numerals and detailed description thereof will be omitted.

As shown in FIG. 17(*a*), in the band elimination filter, an upper electrode 2010*a* and an upper electrode 2010*b* have different lengths in the lateral direction in this drawing, and the upper electrode 2011*a* is longer than the lower electrode 2011*b*. On the other hand, a lower electrode 2011*a* and a lower electrode 2011*b* also have different lengths, and the lower electrode 2011*b* is longer than the upper electrode 2010*b*. Furthermore, the lower electrode 2011*a* is grounded, while the lower electrode 2011*b* is not grounded. Instead, the upper electrode 2010*b* is grounded.

In such a configuration, there are formed three parts each having an in between piezoelectric layer 2002, that is, (A) a part having the upper electrode 2010*a* and the lower electrode 2011*a* opposite to each other, (B) a part having the upper electrode 2010*b* and the lower electrode 2011*b* opposite to each other and (C) a part having the upper electrode 2010*a* and the lower electrode 2011*b* opposite to each other. The part (A) constitutes a first resonator 2008, the part (B) constitutes a second resonator 2009, and the part (C) constitutes a capacitor 2012, which is equivalent to the capacitor 1003 in the embodiment 4.

In the example shown in FIG. 17(*b*), in the part (C) described above, the piezoelectric layer 2002 is thinned compared to those in the other parts (A) and (B). This can increase the capacitance of the capacitor 2012.

In the example shown in FIG. 17(*c*), in the part (C) described above, a dielectric 2013 is inserted between the upper electrode 2010*a* and the lower electrode 2011*b* instead of the piezoelectric layer 2002. This allows the capacitance of the capacitor 2012 to be set to a desired value and the isolation between the resonators to be improved.

Also in the case of using the capacitor, three or more piezoelectric resonators may be used. In such a case, all the sections between the electrodes of adjacent piezoelectric resonators may have an overlap of the upper electrode and the lower electrode and, therefore, their respective capacitors. Alternatively, a part of the sections between the electrodes of adjacent piezoelectric resonators may have no overlap of the upper electrode and the lower electrode and therefore no capacitor. It is essential only that at least one capacitor is provided between at least two piezoelectric resonators. In addition, in mounting, a serial circuit of a plurality of capacitors, a parallel circuit of a plurality of capacitors, or a combination thereof may be used. Furthermore, the configuration of the piezoelectric resonator itself is not limited to that described above.

As in the embodiment 2, the resonance frequency of each piezoelectric resonator can be varied to provide a wider stop band. As in the embodiment 4, a parallel circuit of an inductor and a capacitor or a serial circuit of an inductor and a capacitor may be used as a reactance element. As in the embodiment 5, the reactance element can be formed in the package or mounting substrate, thereby realizing downsizing.

In addition, the acoustic wave filter or the band elimination filter according to the present invention may be used in combination with a filter having another configuration.

In the above description, the piezoelectric resonator has the cavities 2007*a* and 2007*b* formed by forming depressions on the substrate 2001. However, the cavities may be formed by forming through holes from the bottom of the substrate, or acoustic mirrors may be used instead of forming the cavities. Besides, in the above description, the first resonator 2008 and the second resonator 2009 each have the electrodes formed on the both principal planes of the piezoelectric layer. However, without being limited to this configuration, the resonators may have any configuration as far as they have resonance and antiresonance characteristics.

In the above description, the inductor 2006 and the capacitor 2012 are both formed on the substrate 2001. However, they may be provided outside the substrate 2001 and coupled to the resonators by a bonding wire or the like.

In each embodiment described above, the reactance element is an inductor, a capacitor or a combination thereof. However, the reactance element in the present invention may be implemented by the surface acoustic wave resonator or piezoelectric resonator described above. In such a case, the configuration of the band elimination filter similar that of the π-connection bandpass filter shown in FIG. 20(*a*). However, the surface acoustic wave resonator or piezoelectric resonator can be made to function as a capacitive reactance element, if the resonance frequency thereof is shifted by a predetermined amount from those of the other acoustic resonators. Here, the predetermined amount is such an amount that the resonance and antiresonance frequencies of the acoustic resonators as primary resonators are equal to or lower than the resonance frequency of the acoustic resonator as the reactance element, or equal to or higher than the antiresonance frequency thereof. At the frequency satisfying this condition, the acoustic resonator as a reactance element has a capacitive characteristic, and thus, the same effect as in the embodiments described above can be attained.

Embodiment 7

In the following, a communication apparatus according to an embodiment 7 of the present invention will be described with reference to the drawings.

Figure 18:
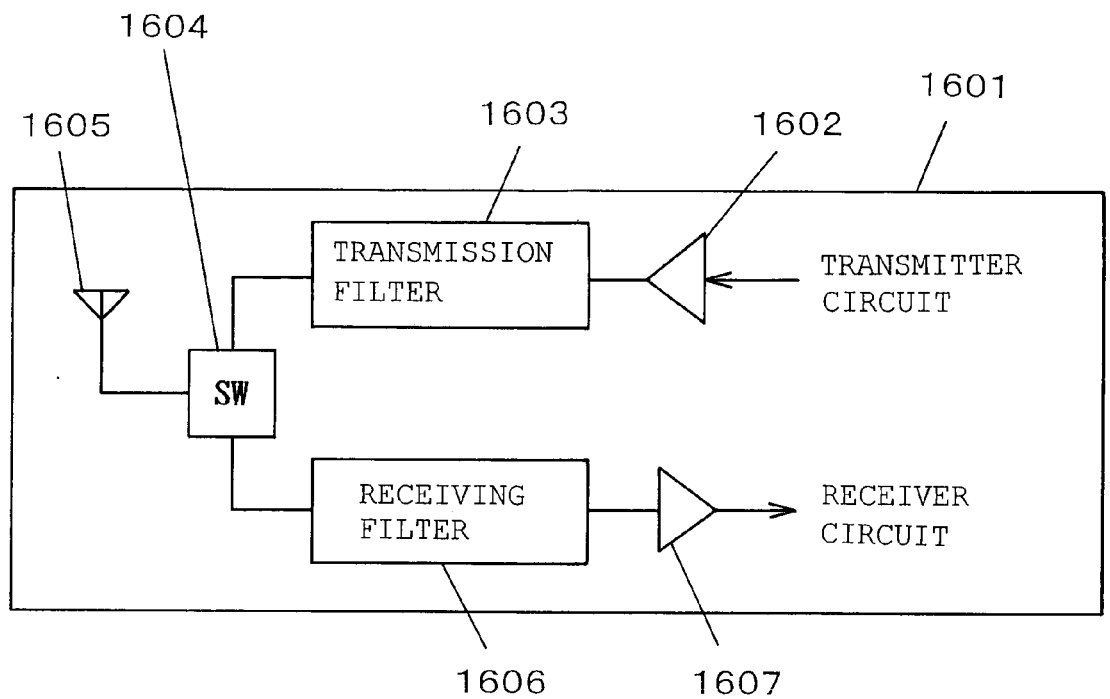
FIG. 18(a) is a block diagram showing a communication apparatus according to an embodiment 7.
FIG. 18(b) is a block diagram showing a communication apparatus using a duplexer according to the embodiment 7.
Figure 18:
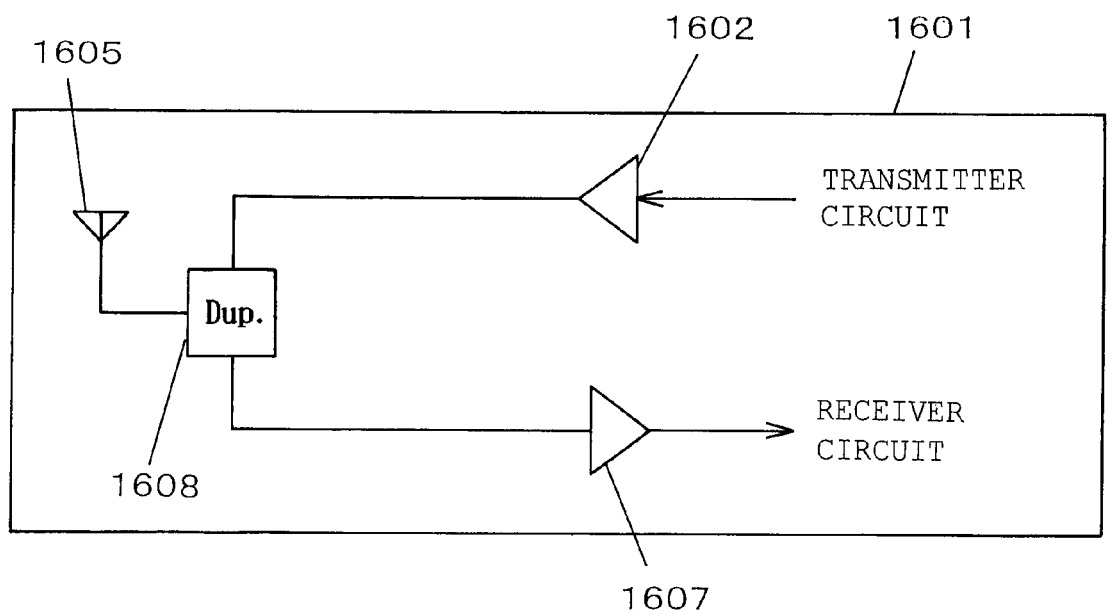

FIG. 18(*a*) is a block diagram showing a communication apparatus 1601 according to the present invention. In FIG. 18(*a*), a transmission signal output from a transmitter circuit is transmitted from an antenna 1605 via a transmission amplifier 1602, a transmission filter 1603 and a switch 1604. A reception signal received at the antenna 1605 is input to a receiver circuit via a switch 1604, a receiving filter 1606 and a receiving amplifier 1607. The transmission amplifier 1602 and the transmission filter 1603 correspond to transmission means according to the present invention, and the receiving filter 1606 and the receiving amplifier 1607 correspond to receiving means according to the present invention.

By applying the band elimination filter according to the present invention to a part of the transmission filter 1603 or a part of the receiving filter 1603 of the communication apparatus 1601, the transmission efficiency or the receiving sensitivity can be improved, respectively. Thus, the communication apparatus can have a higher performance.

In the communication apparatus 1601 described above, the switch 1604 is used as means to switch between transmission and reception. However, as shown in FIG. 18(*b*), it may be replaced with an antenna duplexer 1808. If the band elimination filter according to the present invention is applied to a part of the transmission filter or a part of the receiving filter of the antenna duplexer 1608, an adequate amount of attenuation in the stop band can be assured, and an adequate isolation between the transmission and the reception can be assured. Here, the transmission filter and the receiving filter each correspond to a filter device according to the present invention. Furthermore, the antenna duplexer 1608 corresponds to an antenna duplexer according to the present invention. The filter device according to the present invention may be implemented as a combination of the band elimination filter according to the present invention and another filter as with the transmission filter and the receiving filter in this embodiment, or implemented solely by the band elimination filter according to the present invention.

According to the present invention, there can be provided a band elimination filter having a high attenuation within a desired band and a low loss at frequencies lower and higher than the stop band and a communication apparatus or the like having the same band elimination filter.

What is claimed is:

1. A band elimination filter, comprising:
an input terminal and an output terminal;
one capacitor between a first terminal connected to said input terminal and a second terminal connected to said output terminal; wherein
said first terminal is grounded via only a first grounding point;
said second terminal is grounded via only a second grounding point,
a first acoustic resonator is connected between said first terminal and said first grounding point,
a second acoustic resonator is connected between said second terminal and said second grounding point, and
a normalized impedance, which is obtained by normalizing a characteristic impedance of said input terminal or said output terminal, is smaller than 1.5.

2. The band elimination filter according to claim 1, wherein said acoustic resonators are surface acoustic wave resonators formed on a principal surface of a piezoelectric substrate.

3. The band elimination filter according to claim 2, wherein electrode pads of said surface acoustic wave resonators which are grounded are separated from each other on said piezoelectric substrate.

4. The band elimination filter according to claim 1 or 2, further comprising an inductor having a first end coupled to the input terminal and a second end coupled to the output terminal.

5. The band elimination filter according to claim 1, wherein said ground point end of each of said acoustic resonators is independently grounded by wiring on a substrate.

6. A filter device comprising a plurality of filters wherein at least one of the plurality of filters is a band elimination filter according to claim 1.

7. An antenna duplexer, comprising:
a transmission filter; and
a receiving filter;
wherein a band elimination filter according to claim 6 is used as said transmission filter or said receiving filter.

8. A communication apparatus, comprising:
transmission means of transmitting a signal;
receiving means of receiving a signal, and
wherein a band elimination filter according to claim 1 is used in said transmission means and/or said receiving means.

9. The band elimination filter according to claim 1 having passing characteristics that decreases attenuation in a center frequency portion of the attenuation band toward a center-frequency of the pass-band.

10. The band elimination filter according to claim 1, wherein
a first inductor is connected between said first grounding point and said first acoustic resonator, and
a second inductor is connected between said second grounding point and said second acoustic resonator.

11. The band elimination filter according to claim 1, wherein said capacitor is a chip component.

12. The band elimination filter according to claim 1, wherein said capacitor is formed on a piezoelectric substrate.

13. The band elimination filter according to claim 1, wherein said capacitor is formed in a mounting substrate on which said band elimination filter is mounted.

14. The band elimination filter according to claim 13, wherein said mounting substrate is a laminated body having a dielectric layer.

15. The band elimination filter according to claim 13, wherein said acoustic resonators are face-down mounted on said mounting substrate.

16. The band elimination filter according to claim 1, wherein said first and second acoustic resonators have different resonance frequencies.

17. The band elimination filter according to claim 1, wherein said acoustic resonators are piezoelectric resonators.

18. The band elimination filter according to claim 17, wherein said piezoelectric resonators are bulk wave resonators having an upper electrode, a lower electrode and a piezoelectric layer sandwiched between said upper electrode and said lower electrode.

19. The band elimination filter according to claim 18, wherein said piezoelectric layer is composed of a piezoelectric thin film.

20. The band elimination filter according to claim 18, wherein said capacitor is formed using said electrodes of at least one of said bulk wave resonators.

21. A band elimination filter, comprising:
an input terminal and an output terminal;
a first inductor between a first terminal connected directly to said input terminal and a second terminal connected to said output terminal; wherein
said first terminal is grounded via only a first grounding point;
said second terminal is grounded via only a second grounding point,
a first acoustic resonator is connected between said first terminal and said first grounding point, and
a second acoustic resonator is connected between said second terminal and said second grounding point,
wherein a normalized impedance, which is obtained by normalizing a characteristic impedance of said input terminal or said output terminal, is smaller than 1.5.

22. The band elimination filter according to claim 21, wherein said acoustic resonators are piezoelectric resonators.

23. The band elimination filter according to claim 22, wherein said piezoelectric resonators are bulk wave resonators having an upper electrode, a lower electrode and a piezoelectric layer sandwiched between said upper electrode and said lower electrode.

24. The band elimination filter according to claim 23, wherein said piezoelectric layer is composed of a piezoelectric thin film.

25. The band elimination filter according to claim 21, wherein said first and second acoustic resonators have different resonance frequencies.

26. The band elimination filter according to claim 21, wherein said ground point end of each of said acoustic resonators is independently grounded by wiring on a substrate.

27. A filter device comprising a plurality of filters wherein at least one of the plurality of filters is a band elimination filter according to claim 21.

28. An antenna duplexer, comprising:
a transmission filter; and
a receiving filter, wherein a band elimination filter according to claim 27 is used as said transmission filter or said receiving filter.

29. The band elimination filter according to claim 21 having passing characteristics that decreases attenuation in a center frequency portion of the attenuation band toward a center-frequency of the pass-band.

30. A communication apparatus, comprising:
transmission means of transmitting a signal;
receiving means of receiving a signal, and
wherein a band elimination filter according to claim 21 is used in said transmission means and/or said receiving means.

31. The band elimination filter according to claim 21, wherein
a second inductor is connected between said first grounding point and said first acoustic resonator, and
a third inductor is connected between said second grounding point and said second acoustic resonator.

32. The band elimination filter according to claim 21, wherein said acoustic resonators are surface acoustic wave resonators formed on a principal surface of a piezoelectric substrate.

33. The band elimination filter according to claim 32, wherein electrode pads of said surface acoustic wave resonators which are grounded are separated from each other on said piezoelectric substrate.

34. The band elimination filter according to claim 21, further comprising a capacitor formed on a piezoelectric substrate, and connected between the first terminal and the second terminal.

35. The band elimination filter according to claim 21, further comprising a capacitor formed in a mounting substrate on which said band elimination filter is mounted and connected between the first terminal and the second terminal.

36. The band elimination filter according to claim 35, wherein said mounting substrate is a laminated body having a dielectric layer.

37. The band elimination filter according to claim 35, wherein said acoustic resonators are face-down mounted on said mounting substrate.

* * * * *

UNITED STATES PATENT AND TRADEMARK OFFICE
CERTIFICATE OF CORRECTION

PATENT NO. : 7,084,718 B2 Page 1 of 1
APPLICATION NO. : 10/657944
DATED : August 1, 2006
INVENTOR(S) : Hiroyuki Nakamura et al.

It is certified that error appears in the above-identified patent and that said Letters Patent is hereby corrected as shown below:

<u>Title Page, Item (75) Inventors</u>

Change "Shun-Ichi Seki" to -- Shun-ichi Seki --

Signed and Sealed this

Sixteenth Day of January, 2007

JON W. DUDAS
*Director of the United States Patent and Trademark Office*